US012108613B2

(12) United States Patent
Kim et al.

(10) Patent No.: US 12,108,613 B2
(45) Date of Patent: Oct. 1, 2024

(54) PHOTOELECTRIC CONVERSION DEVICES

(71) Applicant: SAMSUNG ELECTRONICS CO., LTD., Suwon-si (KR)

(72) Inventors: Keewon Kim, Suwon-si (KR); Byeongtaek Bae, Yongin-si (KR); Dail Eom, Hwaseong-si (KR); Minkyung Lee, Hwaseong-si (KR); Hajin Lim, Seoul (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 465 days.

(21) Appl. No.: 17/510,576

(22) Filed: Oct. 26, 2021

(65) Prior Publication Data

US 2022/0238604 A1 Jul. 28, 2022

(30) Foreign Application Priority Data

Jan. 26, 2021 (KR) .................. 10-2021-0011033

(51) Int. Cl.
 *H10K 39/32* (2023.01)
 *H10K 30/87* (2023.01)
(52) U.S. Cl.
 CPC ............ *H10K 39/32* (2023.02); *H10K 30/87* (2023.02)
(58) Field of Classification Search
 CPC ....... H01L 27/14629; H01L 27/14665–14676; H10K 30/87; H10K 39/32–34
 See application file for complete search history.

(56) References Cited

U.S. PATENT DOCUMENTS 8,476,682 B2 7/2013 Kim et al.
9,780,130 B2 10/2017 Suh et al.
(Continued)

FOREIGN PATENT DOCUMENTS

KR 10-1925510 8/2016
KR 10-2019-0053234 A 5/2019
(Continued)

OTHER PUBLICATIONS

Siegmund et al., "Organic narrowband near-infrared photodetectors based on intermolecular charge-transfer absorption", Nature Communications, 2017, pp. 1-6.
(Continued)

*Primary Examiner* — Daniel P Shook
(74) *Attorney, Agent, or Firm* — F. CHAU & ASSOCIATES, LLC

(57) ABSTRACT

A photoelectric conversion device includes a substrate and a wiring layer disposed on the substrate. The wiring layer includes a wiring structure and a wiring insulating layer that surrounds the wiring structure. A reflective layer is disposed on the wiring layer. The reflective layer is electrically connected to the wiring structure. A semi-permeable metal layer is spaced apart from the reflective layer in a thickness direction of the substrate. The semi-permeable metal layer faces the reflective layer to form a microcavity between the reflective layer and the semi-permeable metal layer. A stacked structure is between the reflective layer and the semi-permeable metal layer in the thickness direction of the substrate. The stacked structure includes a photoelectric conversion layer, a transparent electrode layer, and an insulating optical spacer.

20 Claims, 23 Drawing Sheets

(56) References Cited

U.S. PATENT DOCUMENTS

| | | | |
|---|---|---|---|
| 10,177,200 | B2 | 1/2019 | Joei |
| 10,727,446 | B2 | 7/2020 | Li et al. |
| 2017/0331062 | A1* | 11/2017 | Tamaki ................. H01L 31/10 |
| 2018/0198005 | A1 | 7/2018 | Siegmund et al. |
| 2020/0035729 | A1 | 1/2020 | Lee et al. |
| 2020/0077055 | A1 | 3/2020 | Kim et al. |
| 2020/0127039 | A1 | 4/2020 | Saito et al. |
| 2020/0227642 | A1* | 7/2020 | Yaacobi-Gross .... H10K 85/211 |

FOREIGN PATENT DOCUMENTS

| | | |
|---|---|---|
| KR | 10-2019-0107663 A | 9/2019 |
| KR | 10-2020-0011689 A | 2/2020 |
| KR | 10-2020-0026348 A | 3/2020 |
| KR | 10-2105054 | 4/2020 |

OTHER PUBLICATIONS

London et al. "Donor-Acceptor Polymers with Tunable Infrared Photoresponse", The Royal Society of Chemistry, 2013, pp. 1-10.

Verstraeten et al. Near-Infrared Organic Photodetectors Based on Bay-Annulated Indigo Showing Broadband Absorption and High Detectivities up to 1.1 Lm, the Royal Society of Chemistry, 2018, pp. 11645-11650.

Malinowski et al., "Thin-Film Quantum Dot Photodiode for Monolithic Infrared Image Sensors" Sensors, 2017, 17, 2867, pp. 1-10.

Lin et al., "Near-Infrared and Short-Wavelength Infrared Photodiodes Based on Dye-Perovskite Composites", Adv. Funct. Mater, 2017, 27, 1702485, pp. 1-7.

S. Manda et al., "High-Definition Visible-SWIR InGaAs Image Sensor Using Cu—Cu Bonding of III-V to Silicon Wafer", 2019 IEDM_SONY_pp. 16.7.2-16.7.4.

Fraenkel et al, "SCD's cooled and uncooled photo detectors for NIR-SWIR", 2012, Proc. SPIE, pp. 835305-1-835305-10.

Ackland, et al. "A Monolithic Ge-on-Si CMOS Imager for Short Wave Infrared", ISSW2009, NoblePeak Vision, 5 pages.

Ackland, et al. "A Low Dark Current and High Quantum Efficiency Monolithic Germanium-on-Silicon CMOS Imager Technology for Day and Night Imaging Applications", 2010, IEDM, NoblePeak, pp. 14.4.1-14.4.4.

Chen et al., "An Up-to-1400nm 500MHz Demodulated Time-of-Flight Image Sensor on a Ge-on-Si Platform", 2020 IEEE International Solid-State Circuits Conference, pp. 98-100.

Georgitzikis et al., "Organic- and QD-based image sensors integrated on 0.13 μm CMOS ROIC for high resolution, multispectral infrared imaging", ISW2019, IMEC, 5 pages.

Hendriks et al., "Small-Bandgap Semiconducting Polymers with High Near-Infrared Photoresponse", 2014 American Chemical Society, pp. 12130-12136.

Office Action issued in Corresponding Application No. KR Patent Application No. 10-2021-0011033 on Jun. 24, 2024.

* cited by examiner

PHOTOELECTRIC CONVERSION DEVICES

CROSS-REFERENCE TO RELATED APPLICATION

This application claims priority under 35 U.S.C. § 119 to Korean Patent Application No. 10-2021-0011033, filed on Jan. 26, 2021 in the Korean Intellectual Property Office, the disclosure of which is incorporated by reference in its entirety herein.

1. TECHNICAL FIELD

The present inventive concepts relate to a photoelectric conversion device, and more particularly, to a photoelectric conversion device for detecting light with a particular wavelength band.

2. DISCUSSION OF RELATED ART

A photoelectric conversion device detects light by converting light into electrical energy. Photoelectric conversion devices have increasingly varied applications, such as security, facial recognition, autonomous driving, virtual reality (VR), and augmented reality (AR). Therefore, there is an increasing demand for developing a photoelectric conversion device for detecting light of various specific wavelength bands. In general, a photoelectric conversion layer for converting light into electrical energy in the photoelectric conversion device is composed of silicon. However, a detectable wavelength band is limited and the photoelectric conversion layer has an indirect bandgap which leads to a decrease in light conversion efficiency.

SUMMARY

The present inventive concepts provide a photoelectric conversion device that detects light of a specific wavelength band with increased light conversion efficiency.

Accordingly, embodiments of the present inventive concepts provide the following photoelectric conversion devices.

According to an embodiment of the present inventive concepts, a photoelectric conversion device includes a substrate and a wiring layer disposed on the substrate. The wiring layer includes a wiring structure and a wiring insulating layer that surrounds the wiring structure. A reflective layer is disposed on the wiring layer. The reflective layer is electrically connected to the wiring structure. A semi-permeable metal layer is spaced apart from the reflective layer in a thickness direction of the substrate. The semi-permeable metal layer faces the reflective layer to form a microcavity between the reflective layer and the semi-permeable metal layer. A stacked structure is between the reflective layer and the semi-permeable metal layer in the thickness direction of the substrate. The stacked structure includes a photoelectric conversion layer, a transparent electrode layer, and an insulating optical spacer.

According to an embodiment of the present inventive concepts, a photoelectric conversion device includes a substrate comprising a plurality of pixel regions. A wiring layer is disposed on the substrate. The wiring layer includes a wiring structure and a wiring insulating layer that surrounds the wiring structure. A plurality of reflective layers is disposed on the wiring layer. The plurality of reflective layers is electrically connected to the wiring structure and corresponds to the plurality of pixel regions, respectively. Each reflective layer of the plurality of reflective layers functions as a lower electrode. A photoelectric conversion layer is disposed on the plurality of reflective layers and extends over the plurality of pixel regions. A transparent electrode layer covers the photoelectric conversion layer and functions as an upper electrode. An insulating optical spacer covers the transparent electrode layer. A semi-permeable metal layer is spaced apart from the plurality of reflective layers in a thickness direction of the substrate. The semi-permeable metal layer faces the plurality of reflective layers to form a plurality of microcavities therebetween. The semi-permeable metal layer covers the insulating optical spacer over the plurality of pixel regions. A passivation layer covers the semi-permeable metal layer. A plurality of microlenses is disposed on the passivation layer and corresponds to the plurality of pixel regions, respectively.

According to an embodiment of the present inventive concepts, a photoelectric conversion device includes a substrate having a plurality of pixel regions. A wiring layer is disposed on the substrate and includes a wiring structure and a wiring insulating layer that surrounds the wiring structure. A plurality of reflective layers is disposed on the wiring layer. The plurality of reflective layers corresponds to the plurality of pixel regions, respectively. Each of the plurality of reflective layers functions as a lower electrode and has a first thickness. The plurality of reflective layers is electrically connected to the wiring structure. A photoelectric conversion layer extends over the plurality of pixel regions and has a second thickness. The photoelectric conversion layer includes at least one material selected from organic photoelectric material, quantum dot material, organic perovskite material, and inorganic perovskite material. A transparent electrode layer covers the photoelectric conversion layer and functions as an upper electrode. The transparent electrode layer has a third thickness that is less than the first thickness. An insulating optical spacer covers the transparent electrode layer and has a fourth thickness that is greater than the second thickness. A semi-permeable metal layer is over the plurality of pixel regions and covers the insulating optical spacer. The semi-permeable metal layer faces the plurality of reflective layers and is spaced apart from the plurality of reflective layers in a thickness direction of the substrate to form a plurality of microcavities. The semi-permeable metal layer has a fifth thickness that is less than the first thickness. A passivation layer covers the semi-permeable metal layer. A plurality of microlenses is disposed on the passivation layer and corresponds to the plurality of pixel regions, respectively.

BRIEF DESCRIPTION OF THE DRAWINGS

Embodiments of the present inventive concepts will be more clearly understood from the following detailed description taken in conjunction with the accompanying drawings in which.

DETAILED DESCRIPTION OF EMBODIMENTS

Figure 1:
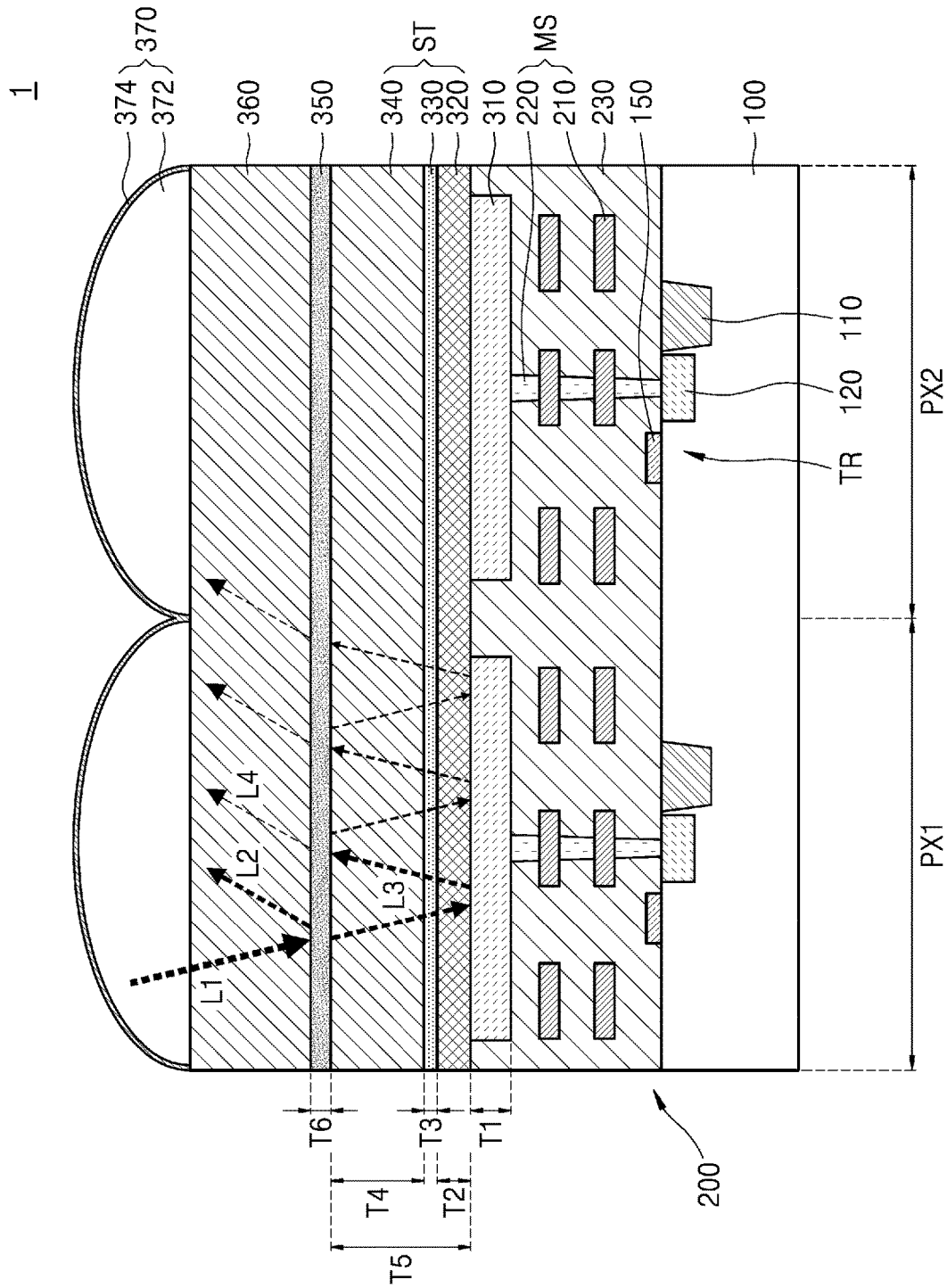
FIG. 1 is a cross-sectional view illustrating main parts of a photoelectric conversion device according to an embodiment of the present inventive concepts.

FIG. 1 is a cross-sectional view illustrating main parts of a photoelectric conversion device according to an embodiment of the present inventive concepts.

Referring to FIG. 1, a photoelectric conversion device 1 may include a substrate 100, a wiring layer 200, a plurality of reflective layers 310, a photoelectric conversion layer 320, a transparent electrode layer 330, an insulating optical spacer 340, and a semi-permeable metal layer 350. The photoelectric conversion device 1 may include a plurality of pixel regions in which a plurality of pixels are disposed. For example, the photoelectric conversion device 1 may include a first pixel region PX1 and a second pixel region PX2.

In an embodiment, the substrate 100 may include, for example, any one of a bulk semiconductor substrate, an epitaxial semiconductor substrate, or a silicon on insulator (SOI) substrate. The substrate 100 may include, for example, silicon (Si). However, embodiments of the present inventive concepts are not limited thereto. For example, the substrate 100 may include a semiconductor element such as germanium (Ge), or a compound semiconductor such as silicon carbide (SiC), gallium arsenide (GaAs), indium arsenide (InAs), and indium phosphide (InP). In some embodiments, the substrate 100 may include a semiconductor substrate having a first conductivity type. For example, the substrate 100 may include a p-type silicon substrate. In some embodiments, the substrate 100 may include a p-type bulk substrate and a p-type or n-type epitaxial layer grown thereon. In some embodiments, the substrate 100 may include an n-type bulk substrate and the p-type or n-type epitaxial layer grown thereon. In some embodiments, the substrate 100 may include an organic plastic substrate.

A device isolation film 110 for defining an active region may be formed in the substrate 100. An impurity region 120 may be formed in a portion of the active region. In some embodiments, the impurity region 120 may be a contact region to which a wiring via 220 is connected. However, embodiments of the present inventive concepts are not limited thereto. For example, in some embodiments, the impurity region 120 may be a floating diffusion region. A plurality of gate electrodes constituting a portion of a plurality of transistors TR may be formed on the substrate 100. For example, the plurality of transistors TR may include a transmission transistor that is configured to transmit charges generated in the photoelectric conversion layer 320 to the floating diffusion region, a reset transistor that is configured to periodically reset the charges stored in the floating diffusion region, a drive transistor that acts as a source follower buffer amplifier and is configured to buffer a signal according to the charges stored in the floating diffusion region, and a selection transistor that acts as switching and addressing element for selecting at least one of the plurality of pixels. However, embodiments of the present inventive concepts are not limited thereto and the plurality of transistors TR may vary.

The wiring layer 200 may be formed on the substrate 100. The wiring layer 200 may include a plurality of wiring patterns 210, a plurality of wiring vias 220, and a wiring insulating layer 230. In an embodiment, the plurality of wiring patterns 210 and the plurality of wiring vias 220 may include, for example, at least one compound selected from tungsten, aluminum, copper, tungsten silicide, titanium silicide, tungsten nitride, titanium nitride, doped polysilicon, and the like. However, embodiments of the present inventive concepts are not limited thereto.

A stacked structure of the plurality of wiring patterns 210 and the plurality of wiring vias 220 may be referred to as a wiring structure MS. The wiring structure MS may be electrically connected to the active region of the substrate 100. For example, as shown in the embodiment of FIG. 1, a lower surface of the wiring via 220 may directly contact the impurity region 120 for electrical connection to the active region of the substrate 100. The plurality of wiring vias 220 may electrically connect some of the plurality of wiring patterns 210 located at different vertical levels to each other, or may electrically connect between some of the plurality of wiring patterns 210 and the active region of the substrate 100, or may electrically connect between some of the plurality of wiring patterns 210 and at least one of the plurality of reflective layers 310.

In some embodiments, at least one of the plurality of wiring patterns 210 and at least one of the plurality of wiring vias 220 may be formed together to form an integrated body. In some embodiments, each of the plurality of wiring patterns 210 and the plurality of wiring vias 220 may have a tapered shape having a width that narrows in a horizontal direction from an upper side to a lower side thereof. That is, the plurality of wiring patterns 210 and the plurality of wiring vias 220 may be wider in a horizontal direction away from the substrate 100. For example, in an embodiment, the plurality of wiring patterns 210 may have a thickness in a range of about 750 μm to about 2,000 μm. In some embodiments, among the plurality of wiring patterns 210, the farthest wiring pattern of the plurality of wiring patterns 210 from the substrate 100 may have the largest thickness, and the closest wiring pattern of the plurality of wiring patterns 210 to the substrate 100 may have the smallest thickness.

For example, as shown in the embodiment of FIG. 1, the wiring via 220 immediately adjacent to the reflective layer 310 may have a larger width than the wiring via 220 immediately adjacent to the impurity region 120.

The wiring insulating layer 230 may be arranged to wrap (e.g., surround) the wiring structure MS, which is the stacked structure of the plurality of wiring patterns 210 and the plurality of wiring vias 220 on the substrate 100. In an embodiment, the wiring insulating layer 230 may include an insulating material such as silicon oxide, silicon nitride, silicon oxynitride, and the like. However, embodiments of the present inventive concepts are not limited thereto.

On the wiring layer 200, the plurality of reflective layers 310 corresponding to the plurality of pixel regions PX1 and PX2, respectively, may be formed. The plurality of reflective layers 310 may have a first thickness T1 (e.g., length in a thickness direction of the substrate 100). For example, in an embodiment, the first thickness T1 thereof may be in a range of about 1,000 Å to about 2,000 Å.

The plurality of reflective layers 310 may be electrically connected to the wiring structure MS. The plurality of reflective layers 310 may be electrically connected to the active region of the substrate 100 through the wiring structure MS to function as a lower electrode. The plurality of reflective layers 310 may include a material having a relatively high reflectivity. For example, in an embodiment, the reflectivity of the plurality of reflective layers 310 may be in a range of about 80% or more for light of the wavelength band to be detected by the photoelectric conversion device 1.

In some embodiments, the plurality of reflective layers 310 may include metal, or conductive metal nitride. For example, in an embodiment, the plurality of reflective layers 310 may include at least one compound selected from aluminum (Al), silver (Ag), an alloy of aluminum and silver, silver-based oxide (Ag—O), an APC alloy (an alloy including Ag, Pd, and Cu), rhodium (Rh), copper (Cu), palladium (Pd), nickel (Ni), ruthenium (Ru), iridium (Ir), platinum (Pt), and titanium nitride (TiN). However, embodiments of the present inventive concepts are not limited thereto. For example, in some embodiments, the plurality of reflective layers 310 may include a multi-layer structure in which a first layer and a second layer are stacked, the first layer including metal or conductive metal nitride and the second layer including a transparent conductive material. For example, the transparent conductive material may include indium tin oxide (ITO), indium zinc oxide (IZO), ZnO, antimony-doped tin oxide (ATO), or Al-doped zinc oxide (AZO). In some embodiments, the plurality of reflective layers 310 may include a distributed Bragg Reflector (DBR). For example, the plurality of reflective layers 310 may include a plurality of layers in which a low refractive index layer and a high refractive index layer each having a thickness of m$\lambda$/4n are alternately stacked. Here, $\lambda$ is a wavelength of the light to be reflected, n is a refractive index of a medium, and m is an odd number. The low refractive index layer may include, for example, silicon oxide ($SiO_2$, refractive index of 1.4) or aluminum oxide ($Al_2O_3$, refractive index of 1.6), and the high refractive index layer may include, for example, silicon nitride ($Si_3N_4$, refractive index of 2.05~2.25), titanium nitride ($TiO_2$, refractive index is 2 or more), or Si—H (refractive index is 3 or more).

The photoelectric conversion layer 320 may be formed on the plurality of reflective layers 310. For example, the photoelectric conversion layer 320 may be formed directly on an upper surface of the plurality of reflective layers 310 (e.g., in a thickness direction of the substrate 100). The photoelectric conversion layer 320 may extend in a horizontal direction and cover the plurality of reflective layers 310 over the plurality of pixel regions, such as the first and second pixel regions PX1 and PX2. That is, portions of the photoelectric conversion layer 320 disposed in each of the plurality of pixel regions, such as the first and second pixel regions PX1 and PX2, may constitute the plurality of pixels. The photoelectric conversion layer 320 may have a second thickness T2 (e.g., length in a thickness direction of the substrate 100). For example, in an embodiment, the photoelectric conversion layer 320 may include at least one material selected from an organic photoelectric material, quantum dot material, organic perovskite material, and inorganic perovskite material. However, embodiments of the present inventive concepts are not limited thereto. The photoelectric conversion layer 320 may be formed through a deposition method, a coating method, or a printing method. For example, the organic photoelectric material may be bay-annulated indigo (BAI), the quantum dot material may be PbS, or InAs, and the perovskite material may be $MAPbX_3$ ($CH_3NH_3PbX_3$). However, embodiments of the present inventive concepts are not limited thereto. The photoelectric conversion layer 320 may include at least one material selected from the organic photoelectric material, the quantum dot material, the organic perovskite material, and the inorganic perovskite material that absorbs the light of the wavelength band to be detected by the photoelectric conversion device 1 to cause photoelectric conversion.

In some embodiments, the photoelectric conversion layer 320 may have a stacked structure that may include a base photoelectric conversion layer including at least one material selected from the organic photoelectric material, the quantum dot material, the organic perovskite material, and the inorganic perovskite material, an electron blocking layer (EBL) covering a bottom surface of the base photoelectric conversion layer, and a hole blocking layer (HBL) covering a top surface of the base photoelectric conversion layer. For example, the EBL and the HBL may include AlGaN.

The transparent electrode layer 330 may be formed on the photoelectric conversion layer 320. For example, as shown in the embodiment of FIG. 1, the transparent electrode layer 330 may be disposed directly on the photoelectric conversion layer 320 (e.g., in a thickness direction of the substrate 100). The transparent electrode layer 330 may cover the photoelectric conversion layer 320 over the plurality of pixel regions, such as the first and second pixel regions PX1 and PX2. The transparent electrode layer 330 may have a third thickness T3 (e.g., length in a thickness direction of the substrate 100). In some embodiments, the third thickness T3 may be less than each of the first thickness T1 and the second thickness T2. For example, in an embodiment, the third thickness T3 may be in a range of about 100 Å to about 300 Å. For example, in an embodiment, the transparent electrode layer 330 may include ITO, IZO, ZnO, ATO, or AZO. However, embodiments of the present inventive concepts are not limited thereto.

Each of the plurality of reflective layers 310, a portion of the photoelectric conversion layer 320 and a portion of the transparent electrode layer 330 that each vertically overlap each of the plurality of reflective layers 310 may constitute a unit photoelectric device for each pixel. For example, the photoelectric conversion device 1 may include a plurality of unit photoelectric devices for the plurality of pixels. The transparent electrode layer 330 may function as an upper electrode of the plurality of unit photoelectric devices, and the plurality of reflective layers 310 may function as the lower electrode of the plurality of unit photoelectric devices.

The transparent electrode layer 330 may be electrically connected to the wiring structure MS through a conductive via.

The insulating optical spacer 340 may be formed on the transparent electrode layer 330. The insulating optical spacer 340 may cover the transparent electrode layer 330. The insulating optical spacer 340 may have a fourth thickness T4 (e.g., length in a thickness direction of the substrate 100). In an embodiment, the insulating optical spacer 340 may include oxide, nitride, oxynitride, or combinations thereof. However, embodiments of the present inventive concepts are not limited thereto. The photoelectric conversion layer 320, the transparent electrode layer 330, and the insulating optical spacers 340 may respectively include materials having similar refractive indexes.

A stacked structure ST including the photoelectric conversion layer 320, the transparent electrode layer 330, and the insulating optical spacer 340 may have a fifth thickness T5 (e.g., length in a thickness direction of the substrate 100). The fifth thickness T5 may be selected considering the wavelength band of the light to be detected by the photoelectric conversion device 1. For example, in an embodiment, the fifth thickness T5 may be a value that is about ¼ (λ/4) of the wavelength λ of light to be detected by the photoelectric conversion device 1 that penetrates the stacked structure ST. For example, when the light to be detected by the photoelectric conversion device 1 has a wavelength of 1,400 nm and enters the stacked structure ST in the vertical direction, assuming that the refractive index of each of the photoelectric conversion layer 320, the electrode layer 330, and the insulating optical spacer 340 is 1 for the convenience of calculation, the fifth thickness T5 may be in a range of about 3,500 Å which is about ¼ of 1,400 nm.

Thus, the insulating optical spacer 340 may be formed to have the fourth thickness T4, which is a value obtained by subtracting the third thickness T3 and the second thickness T2 from the fifth thickness T5, wherein the fifth thickness T5 is selected considering the wavelength of the light to be detected by the photoelectric conversion device 1 and the refractive index of each of the photoelectric conversion layer 320, the transparent electrode layer 330, and the insulating optical spacer 340. For example, in an embodiment, the fourth thickness T4 may have a value in a range of about 25% to about 75% of the fifth thickness T5.

In some embodiments, when the light to be detected by the photoelectric conversion device 1 has a relatively long wavelength, the insulating optical spacer 340 may be formed relatively thicker. In some embodiments, the insulating optical spacer 340 may be formed thicker than the photoelectric conversion layer 320. For example, the fourth thickness T4 may be greater than the second thickness T2. In some embodiments, the second thickness T2 may be in a range of about 500 Å to about 1,000 Å, and the fourth thickness T4 may be in a range of about 1,500 Å or more. However, embodiments of the present inventive concepts are not limited thereto.

A semi-permeable metal layer 350 may be formed on the insulating optical spacer 340. For example, as shown in the embodiment of FIG. 1, the semi-permeable metal layer 350 may be disposed directly on an upper surface of the insulating optical spacer 340 (e.g., in a thickness direction of the substrate 100). The semi-permeable metal layer 350 may cover the insulating optical spacer 340 over the plurality of pixel regions, such as the first and second pixel regions PX1 and PX2. The semi-permeable metal layer 350 may have a sixth thickness T6 (e.g., length in a thickness direction of the substrate 100). As shown in the embodiment of FIG. 1, the sixth thickness T6 may be less than the first thickness T1. In some embodiments, the sixth thickness T6 may be greater than the third thickness T3. For example, the sixth thickness T6 may be in a range of about 200 Å to about 400 Å. However, embodiments of the present inventive concepts are not limited thereto.

The semi-permeable metal layer 350 may have semi-permeability for light of the wavelength band to be detected by the photoelectric conversion device 1. For example, in an embodiment, a light transmittance of the semi-permeable metal layer 350 may be in a range of about 30% to about 70% for the light of the wavelength band to be detected by the photoelectric conversion device 1. Therefore, a reflectivity of the semi-permeable metal layer 350 may be in a range of about 70% to 30% for the light of the wavelength band to be detected by the photoelectric conversion device 1. The reflectivity of the semi-permeable metal layer 350 may be less than the reflectivity of the plurality of reflective layers 310.

In an embodiment, the semi-permeable metal layer 350 may include metal material formed to have a relatively thin thickness and to be semi-permeable for the light of the wavelength band to be detected by the photoelectric conversion device 1. For example, the semi-permeable metal layer 350 may include metal, or conductive metal nitride. For example, the semi-permeable metal layer 350 may include at least one compound selected from aluminum (Al), silver (Ag), an alloy of aluminum and silver, silver-based oxide (Ag—O), an APC alloy (an alloy including Ag, Pd, and Cu), rhodium (Rh), copper (Cu), palladium (Pd), nickel (Ni), ruthenium (Ru), iridium (Ir), platinum (Pt), and titanium nitride (TiN).

Each of the plurality of reflective layers 310 and a corresponding portion of the semi-permeable metal layer 350 overlapping with each other in the vertical direction may be spaced apart from each other (e.g., in a direction parallel to a thickness direction of the substrate 100) to form a microcavity. The photoelectric conversion device 1 may include a plurality of microcavities that are formed by the plurality of reflective layers 310 and the semi-permeable metal layer 350, corresponding to the plurality of pixel regions, such as the first and second pixel regions PX1 and PX2.

The photoelectric conversion device 1 may further include a passivation layer 360 and a plurality of microlenses 370.

The passivation layer 360 may be formed on the semi-permeable metal layer 350. For example, as shown in the embodiment of FIG. 1, a lower surface of the passivation layer 360 may be disposed directly on an upper surface of the semi-permeable metal layer 350 (e.g., in a thickness direction of the substrate 100). The passivation layer 360 may cover the semi-permeable metal layer 350. In an embodiment, the passivation layer 360 may include, for example, oxide, nitride, oxynitride, or combinations thereof. In some embodiments, the passivation layer 360 may include a stacked structure of hafnium oxide, silicon nitride, and hafnium oxide. However, embodiments of the present inventive concepts are not limited thereto.

The plurality of microlenses 370 may be disposed on the passivation layer 360. For example, as shown in the embodiment of FIG. 1, a lower surface of the plurality of microlenses 370 may be disposed directly on an upper surface of the passivation layer 360 (e.g., in a thickness direction of the substrate 100). In some embodiments, the plurality of microlenses 370 may be disposed on the passivation layer 360 in a matrix array or a honeycomb array. In an embodiment, the plurality of microlenses 370 may be arranged to correspond to the plurality of pixel regions, such as the first and second pixel regions PX1 and PX2, respectively. However, embodiments of the present inventive concepts are not limited thereto. Each of the plurality of microlenses 370 may concentrate the light incident on the photoelectric conversion device 1 to each of the plurality of pixel regions, such as the first and second pixel regions PX1 and PX2. In some embodiments, the microlens 370 may include an organic layer 372 and an inorganic layer 374 that conformally covers the surface of the organic layer 372. For example, in an embodiment, the organic layer 372 may include a TMR-based resin (available from Tokyo Ohka Kogyo, Co.), or an MFR-based resin (available from Japan Synthetic Rubber Corporation). However, embodiments of the present inventive concepts are not limited thereto.

Light L2 which is a portion of light L1 incident on the photoelectric conversion device 1 through the microlens 370 may be reflected on the semi-permeable metal layer 350 and released to the outside of the photoelectric conversion device 1, and light L3 which is a remaining portion of light L1 may pass through the semi-permeable metal layer 350 and enter the stacked structure ST. The light L3 incident into the stacked structure ST may be repeatedly reflected between the reflective layer 310 and the semi-permeable metal layer 350, and light L4 which is a portion of the light L3 may pass through the semi-permeable metal layer 350 to be released to the outside while a remaining portion of the light L3 is reflected back towards the reflective layer.

In the photoelectric conversion device 1 according to an embodiment of the present inventive concepts, the plurality of reflective layers 310 and the semi-permeable metal layer 350 may constitute the plurality of microcavities that repeatedly reflect the light L3 incident into the stacked structure ST, and thus, light conversion efficiency may be increased.

In the photoelectric conversion device 1 according to an embodiment of the present inventive concepts, the photoelectric conversion layer 320 may be formed separately from the substrate 100, and thus, when the photoelectric conversion layer 320 is formed to include at least one material selected from the organic photoelectric material, the quantum dot material, and the organic or inorganic perovskite material that are suitable for the light of the wavelength band to be detected by the photoelectric conversion device 1, light of various wavelength bands may be detected.

In the photoelectric conversion device 1 according to an embodiment of the present inventive concepts, the stacked structure ST formed by the photoelectric conversion layer 320, the transparent electrode layer 330, and the insulating optical spacer 340 may be arranged between the plurality of reflective layers 310 and the semi-permeable metal layer 350 that constitute the plurality of microcavities, so that even when detecting light of a relatively long wavelength band, the photoelectric conversion layer 320 may be made thinner and thus, the manufacturing cost and the ease of process may be increased.

In addition, in the photoelectric conversion device 1 according to an embodiment of the present inventive concepts, the plurality of reflective layers 310 may function as the lower electrode and the transparent electrode layer 330 formed at a relatively small separation distance corresponding to the second thickness T2 from the reflective layers 310 may function as the upper electrode, instead of the semi-permeable metal layer 350 formed at a relatively large separation distance corresponding to the fifth thickness T5, and thus, electrical characteristics may be increased and light conversion efficiency may be increased.

Figure 2A:
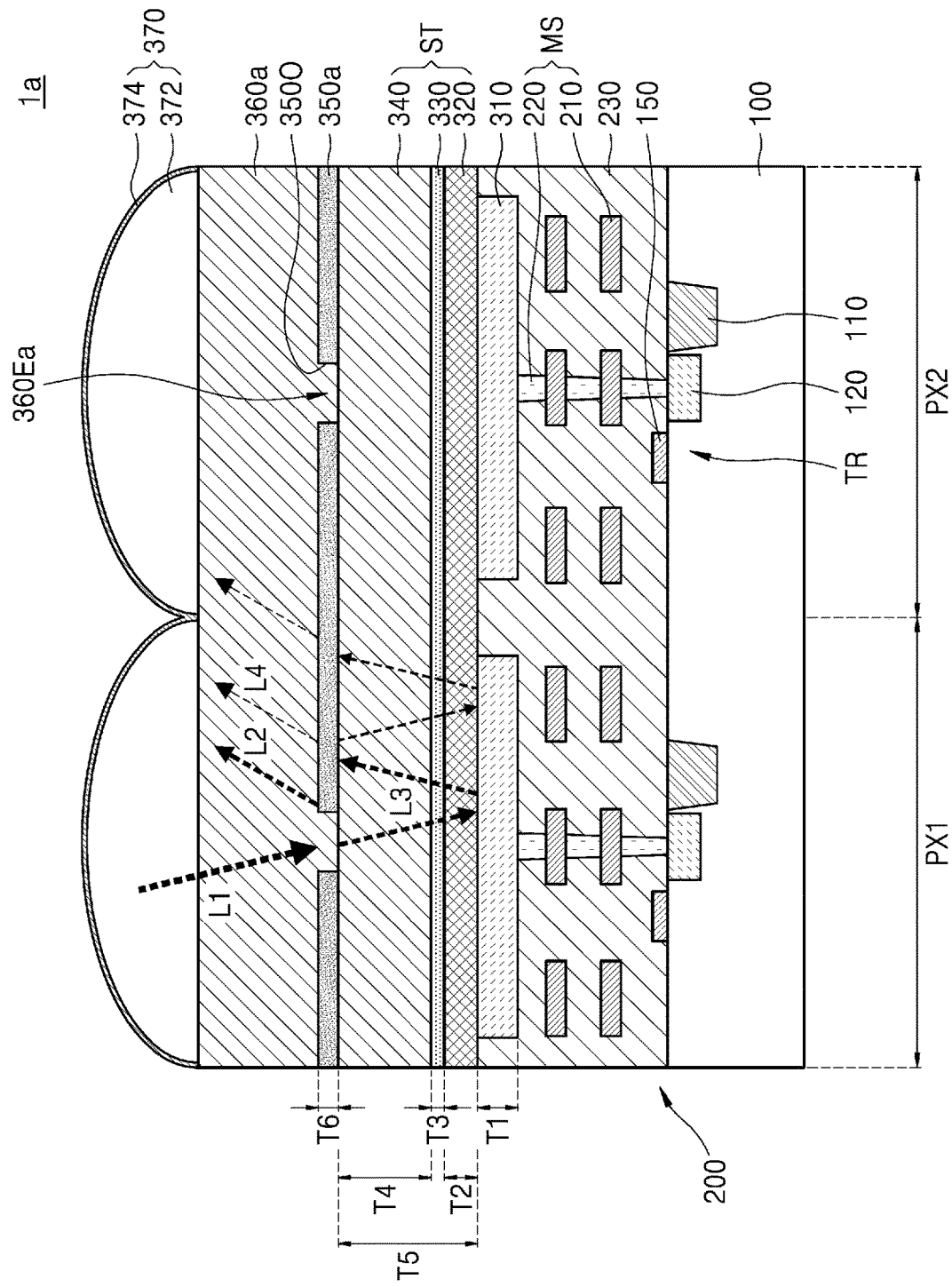
FIG. 2A is a cross-sectional view illustrating main parts of a photoelectric conversion device according to an embodiment of the present inventive concepts.
Figure 2B:
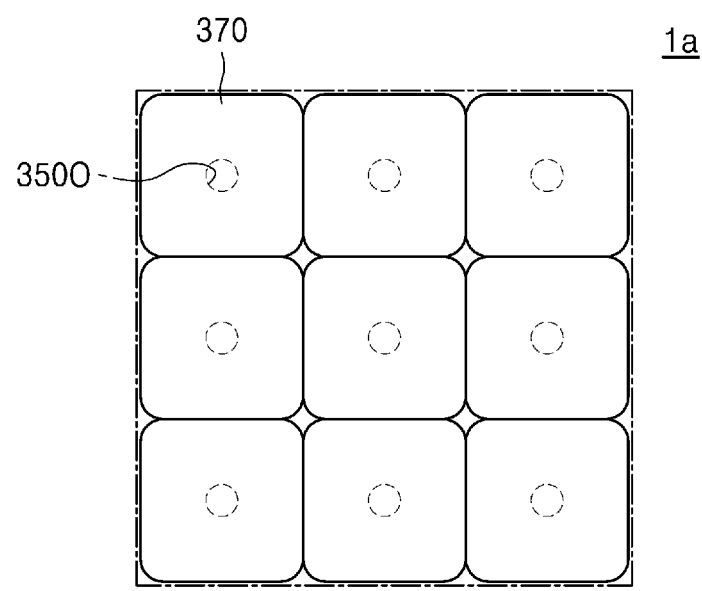
FIG. 2B is a plan view illustrating some of components of the photoelectric conversion device of FIG. 2A according to an embodiment of the present inventive concepts.

FIG. 2A is a cross-sectional view illustrating main parts of a photoelectric conversion device according to an embodiment of the present inventive concept, and FIG. 2B is a plan layout illustrating some of components of the photoelectric conversion device. In FIGS. 2A and 2B, the same member numerals as in FIG. 1 show the same components, and the duplicate descriptions thereof are omitted for convenience of explanation.

Referring to FIGS. 2A and 2B together, a photoelectric conversion device 1a may include the substrate 100, the wiring layer 200, the plurality of reflective layers 310, the photoelectric conversion layer 320, the transparent electrode layer 330, the insulating optical spacer 340, and a semi-permeable metal layer 350a. The photoelectric conversion device 1a may further include a passivation layer 360a and the plurality of microlenses 370.

The semi-permeable metal layer 350a may be formed on the insulating optical spacer 340 (e.g., directly thereon in a thickness direction of the substrate 100). The semi-permeable metal layer 350a may cover a portion of the insulating optical spacer 340. The semi-permeable metal layer 350a may have a maximum thickness of the sixth thickness T6.

The semi-permeable metal layer 350a may have semi-permeability for light of the wavelength band to be detected by the photoelectric conversion device 1a. For example, in an embodiment, a light transmittance of the semi-permeable metal layer 350a may be in a range of about 30% to about 70% for the light of the wavelength band to be detected by the photoelectric conversion device 1a. The semi-permeable metal layer 350a may have a plurality of openings 350O. The plurality of openings 350O may extend from a top surface of the semi-permeable metal layer 350a to a bottom surface thereof. The plurality of openings 350O may fully penetrate the semi-permeable metal layer 350a (e.g., in a thickness direction of the substrate 100), and thus, the insulating optical spacer 340 may be exposed positioned at a bottom surface of the plurality of openings 350O.

In an embodiment, the plurality of openings 350O may be in a center portion of the plurality of microlenses 370 in plan view. For example, the plurality of openings 350O may be formed in a center portion of the plurality of microlenses in a direction parallel to an upper surface of the substrate 100. The plurality of openings 350O may be arranged to overlap the center portion of the plurality of microlenses 370 in the vertical direction (e.g., a direction parallel to a thickness direction of the substrate 100).

The passivation layer 360a may be formed on the semi-permeable metal layer 350a (e.g., directly thereon in a thickness direction of the substrate 100). The passivation layer 360a may fill the plurality of openings 350O and have a plurality of extension portions 360Ea extending toward the insulating optical spacer 340. A lower surface of each of the plurality of extension portions 360Ea of the passivation layer 360a may directly contact an upper surface of the insulating optical spacer 340.

Light L2 which is a portion of light L1 incident on the photoelectric conversion device 1a through the microlens 370 may be reflected on the semi-permeable metal layer 350a and released to the outside of the photoelectric conversion device 1a, and light L3 which is a remaining portion of light L1 may pass through the opening 350O or penetrate the semi-permeable metal layer 350a and enter the stacked structure ST. The light L3 incident into the stacked structure ST may be repeatedly reflected between the reflective layer 310 and the semi-permeable metal layer 350a, and light L4 which is a portion of the light L3 may pass through the semi-permeable metal layer 350a to be released to the outside while the remaining portion of light L3 is reflected back towards the reflective layer 310.

In an embodiment, the light L1 incident on the photoelectric conversion device 1a through the microlens 370 may be focused on the opening 350O of the semi-permeable metal layer 350a vertically overlapping the center portion of the microlens 370. Therefore, the photoelectric conversion device 1a may have the plurality of openings 350O respectively corresponding to the plurality of microlenses 370, and thus, a relatively large amount of the light L1 incident on the photoelectric conversion device 1a through the microlens 370 may be incident into the stacked structure ST, thereby increasing light conversion efficiency.

Figure 3A:
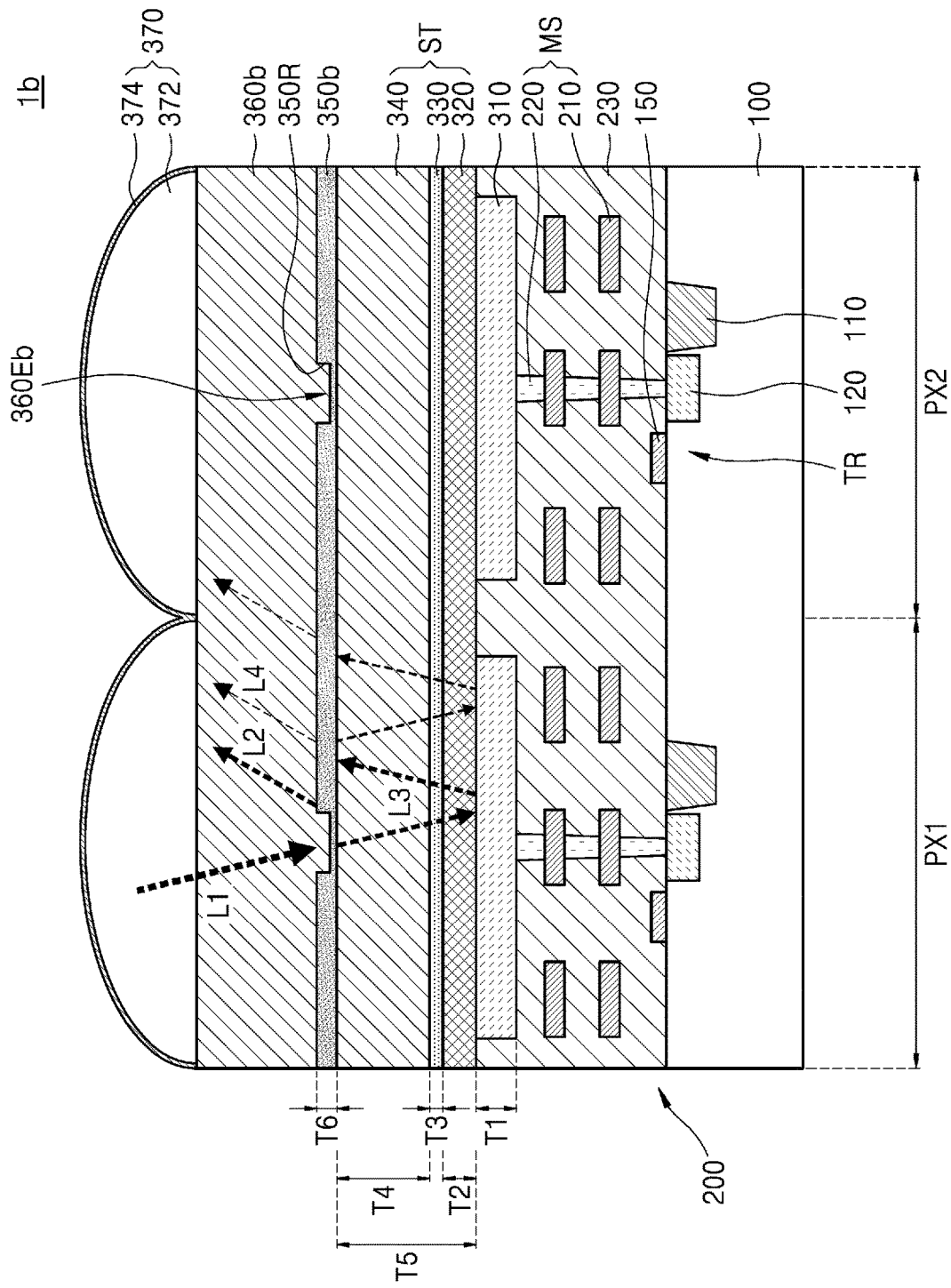
FIG. 3A is a cross-sectional view illustrating main parts of a photoelectric conversion device according to an embodiment of the present inventive concepts.
Figure 3B:
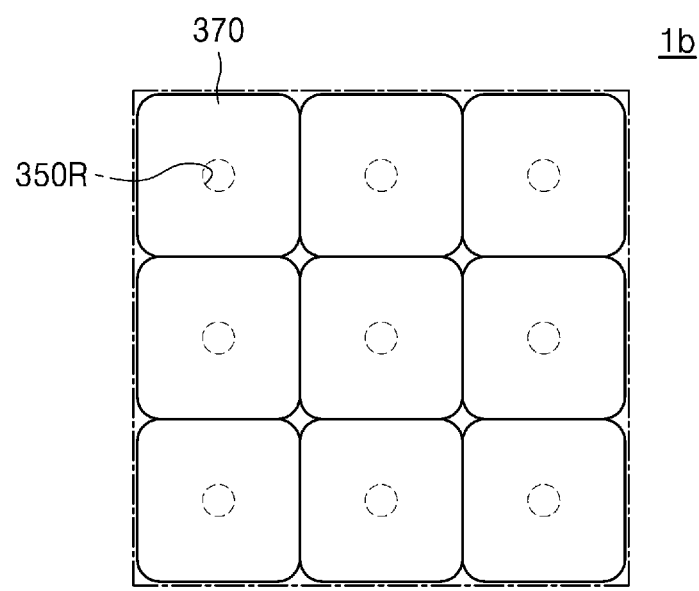
FIG. 3B is a plan view illustrating some components of the photoelectric conversion device of FIG. 3A according to an embodiment of the present inventive concepts.

FIG. 3A is a cross-sectional view illustrating main parts of a photoelectric conversion device according to an embodiment of the present inventive concepts, and FIG. 3B is a plan layout illustrating some of components of the photoelectric conversion device. In FIGS. 3A and 3B, the same reference numerals as in FIGS. 1 to 2B denote the same components, and duplicate descriptions thereof are omitted for convenience of explanation.

Referring to FIGS. 3A and 3B together, a photoelectric conversion device 1b may include the substrate 100, the wiring layer 200, the plurality of reflective layers 310, the photoelectric conversion layer 320, the transparent electrode layer 330, the insulating optical spacer 340, and a semi-permeable metal layer 350b. The photoelectric conversion device 1b may further include a passivation layer 360b and the plurality of microlenses 370.

The semi-permeable metal layer 350b may be formed on the insulating optical spacer 340 (e.g., directly thereon in a thickness direction of the substrate 100). The semi-permeable metal layer 350b may cover the insulating optical spacer 340. The semi-permeable metal layer 350b may have the maximum thickness of the sixth thickness T6.

The semi-permeable metal layer 350b may have semi-permeability for light of the wavelength band to be detected by the photoelectric conversion device 1b. For example, in an embodiment, a light transmittance of the semi-permeable metal layer 350b may be in a range of about 30% to about 90% for the light of the wavelength band to be detected by the photoelectric conversion device 1b. The semi-permeable metal layer 350b may have a plurality of recesses 350R. The plurality of recesses 350R may extend toward the bottom surface of the semi-permeable metal layer 350b. However, the plurality of recesses 350R may not fully penetrate the semi-permeable metal layer 350b. Therefore, the insulating optical spacer 340 may not be exposed on the bottom surface of the plurality of recesses 350R and a portion of the semi-permeable metal layer 350b may be exposed. The portion of the semi-permeable metal layer 350b exposed on the bottom surface of the plurality of recesses 350R may have a relatively thin thickness. For example, the portion of the semi-permeable metal layer 350b exposed on the bottom surface of the plurality of recesses 350R may have a thickness less than the sixth thickness T6. The portion of the semi-permeable metal layer 350b exposed on the bottom surface of the plurality of recesses 350R may have a light transmittance that is greater than the light transmittance of a remaining portion of the semi-permeable metal layer 350b.

In an embodiment, the plurality of recesses 350R may be in the center portion of the plurality of microlenses 370 in a plan view (e.g., in a direction parallel to an upper surface of the substrate 100). The plurality of recesses 350R may be arranged to overlap the center portion of the plurality of microlenses 370 in the vertical direction (e.g., in a direction parallel to a thickness direction of the substrate 100).

The passivation layer 360b may be formed on the semi-permeable metal layer 350b (e.g., directly thereon in a thickness direction of the substrate 100). The passivation layer 360b may fill the plurality of recesses 350R and have a plurality of extension portions 360Eb extending toward the insulating optical spacer 340. Each of the plurality of extension portions 360Eb of the passivation layer 360b may be spaced apart from the insulating optical spacer 340 without contacting the insulating optical spacer 340. For example, as shown in the embodiment of FIG. 3A, the exposed portion of the plurality of recesses 350R may be interposed between the insulating optical spacer 340 and the plurality of extension portions 360Eb in a thickness direction of the substrate 100.

Light L2 which is a portion of the light L1 incident on the photoelectric conversion device 1 through the microlenses 370 may be reflected on the semi-permeable metal layer 350b and released to the outside of the photoelectric conversion device 1b, and light L3 which is a remaining portion of the light L1 may pass through the semi-permeable metal layer 350b and enter the stacked structure ST. The light L3 incident into the stacked structure ST may be repeatedly reflected between the reflective layer 310 and the semi-permeable metal layer 350b, and light L4 which is a portion of the light L3 may pass through the semi-permeable metal layer 350b to be released to the outside while the remaining portion of the light L3 is reflected towards the reflective layer 310.

In an embodiment, the light L1 incident on the photoelectric conversion device 1b through the microlens 370 may be focused on the recess 350R of the semipermeable metal layer 350b vertically overlapping the center portion of the microlens 370, and a portion of the semi-permeable metal layer 350b exposed at the bottom surface of the plurality of recesses 350R may have a relatively high light transmittance, so that a relatively large amount of the light L1 incident on the photoelectric conversion device 1b through the microlens 370 may be incident into the stacked structure ST, thereby increasing the light conversion efficiency of the photoelectric conversion device 1b.

Figure 4A:
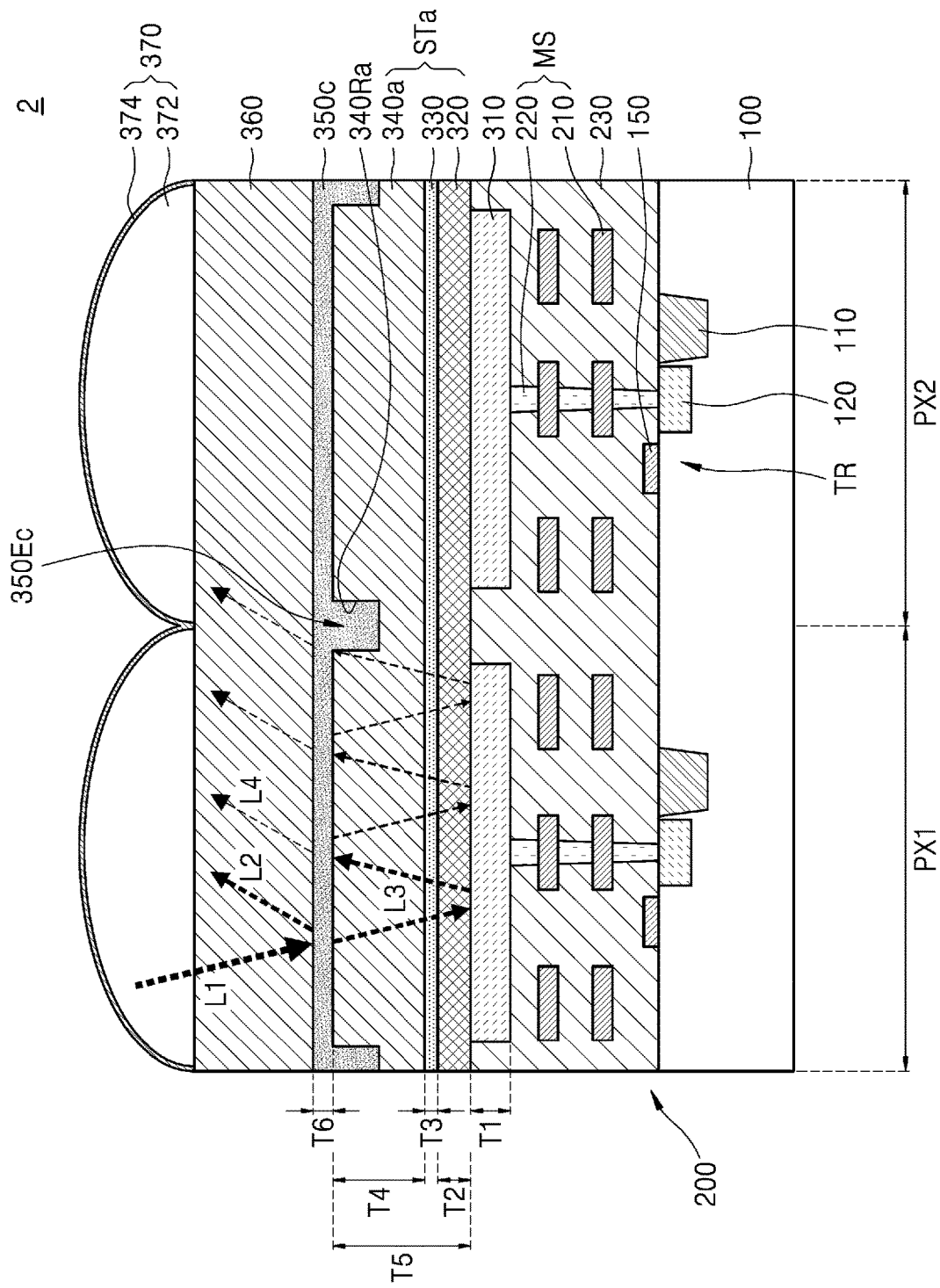
FIG. 4A is a cross-sectional view illustrating main parts of a photoelectric conversion device according to an embodiment of the present inventive concepts.
Figure 4B:
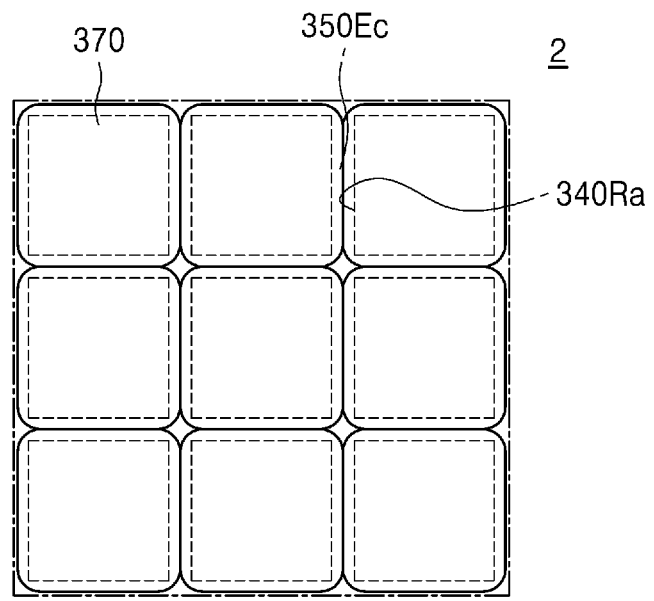
FIG. 4B is a plan view illustrating some of components of the photoelectric conversion device of FIG. 4A according to an embodiment of the present inventive concepts.

FIG. 4A is a cross-sectional view illustrating main parts of a photoelectric conversion device according to an embodiment of the present inventive concepts, and FIG. 4B is a plan layout illustrating some of components of the photoelectric conversion device. In FIGS. 4A and 4B, the same reference numerals as in FIG. 1 denote the same components, and the duplicate descriptions thereof are omitted for convenience of explanation.

Referring to FIGS. 4A and 4B together, a photoelectric conversion device 2 may include the substrate 100, the wiring layer 200, the plurality of reflective layers 310, the photoelectric conversion layer 320, the transparent electrode layer 330, the insulating optical spacer 340a, and a semi-permeable metal layer 350c. A stacked structure STa may include the photoelectric conversion layer 320, the transparent electrode layer 330, and an insulating optical spacer 340a. The photoelectric conversion device 2 may further include the passivation layer 360 and the plurality of microlenses 370.

The insulating optical spacer 340a may have a trench 340Ra. The trench 340Ra may extend inward from a top surface of the insulating optical spacer 340a toward a bottom surface thereof, but may not extend to the bottom surface thereof. The trench 340Ra may be arranged to overlap the edges of the plurality of microlenses 370 in the vertical direction (e.g., in a direction parallel to the thickness direction of the substrate 100). The trench 340Ra may be disposed on the plurality of pixel regions, such as the first and second pixel regions PX1 and PX2 and may extend therebetween.

The semi-permeable metal layer 350c may be formed on the insulating optical spacer 340a. The semi-permeable metal layer 350c may cover the insulating optical spacer 340a. The trench 340Ra may be filled by a light blocking wall 350Ec. In an embodiment, the light blocking wall 350Ec may include the same material as the semi-permeable metal layer 350c. For example, the light blocking wall 350c and the semi-permeable metal layer 350c may be formed together to be one integrated body, and the light blocking wall 350c may be a portion of the integrated body for filling the trench 340Ra and the semi-permeable metal layer 350c may be a portion of the integrated body for covering the top surface of the insulating optical spacer 340a except the trench 340Ra. The semi-permeable metal layer 350c may have semi-permeability for light of the wavelength band to be detected by the photoelectric conversion device 2. The semi-permeable metal layer 350c may have the sixth thickness T6. The passivation layer 360 may be formed on the semi-permeable metal layer 350c and the light blocking wall 350c.

Light L2, which is a portion of light L1 incident on the photoelectric conversion device 2 through the microlenses 370, may be reflected on the semi-permeable metal layer 350c and released to the outside of the photoelectric conversion device 2, and light L3 which is a remaining portion of light L1 may pass through the semi-permeable metal layer 350c and enter the stacked structure ST. The light L3 incident into the stacked structure ST may be repeatedly reflected between the reflective layer 310 and the semi-permeable metal layer 350c, and light L4, which is a portion of the light L3, may pass through the semi-permeable metal layer 350c to be released to the outside and a remaining portion of the light L3 may be reflected towards the reflective layer 310. The light blocking wall 350Ec may extend between the plurality of pixel regions, so that the light incident on one pixel region, for example, the first pixel region PX1, may be blocked to enter an adjacent pixel region, for example, the second pixel region PX2. Therefore, the light blocking wall 350Ec may prevent optical interference from occurring between adjacent pixel regions of the plurality of pixels of the photoelectric conversion device 2, thereby increasing the light detection resolution of the photoelectric conversion device 2.

Figure 5:
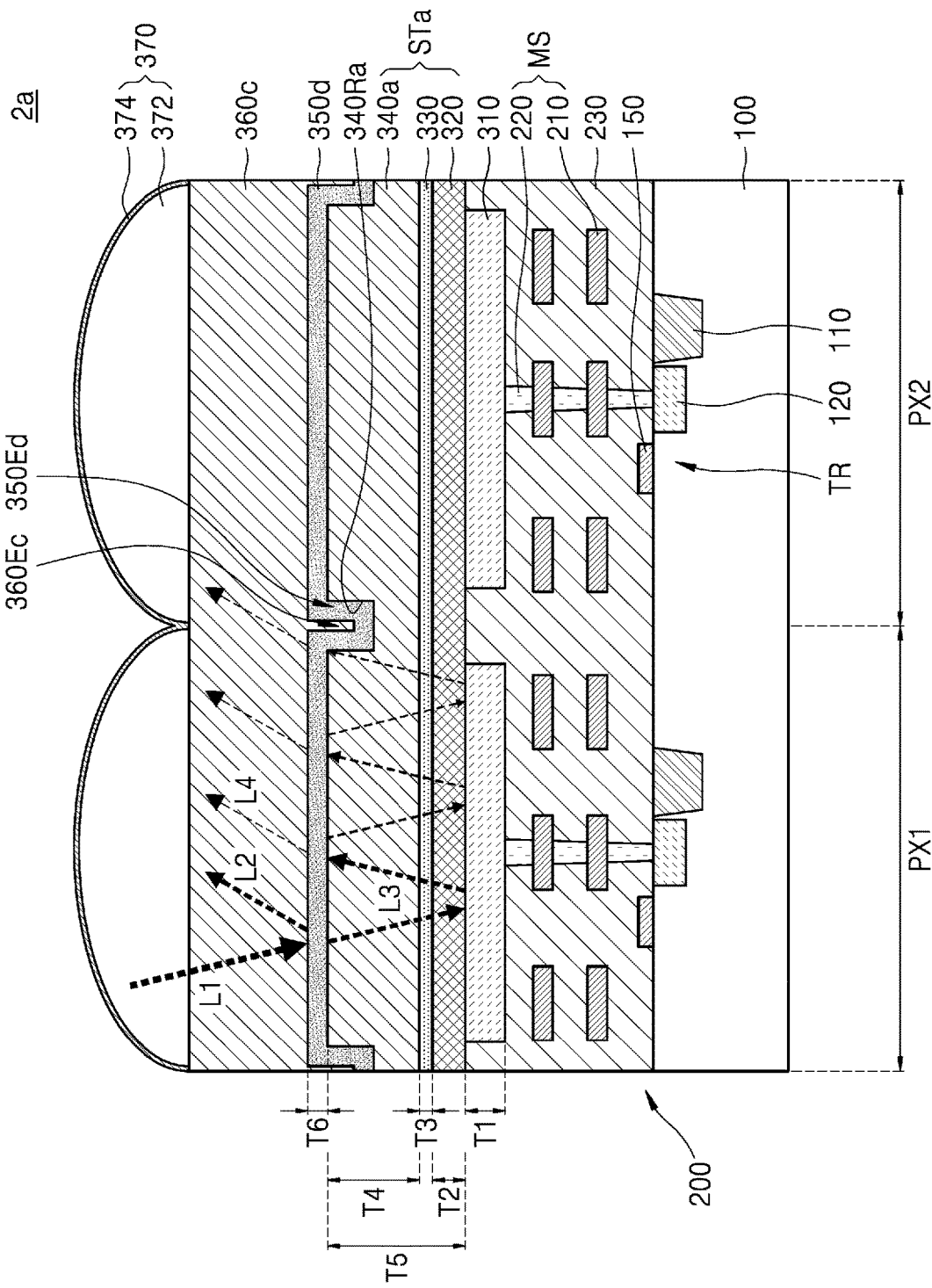
FIG. 5 is a cross-sectional view illustrating main parts of a photoelectric conversion device according to an embodiment of the present inventive concept.

FIG. 5 is a cross-sectional view illustrating main parts of a photoelectric conversion device according to an embodiment of the present inventive concepts. In FIG. 5, the same reference numerals as in FIGS. 1, 4A and 4B denote the same components, and the duplicate descriptions thereof are omitted for convenience of explanation.

Referring to FIG. 5, a photoelectric conversion device 2a may include the substrate 100, the wiring layer 200, the plurality of reflective layers 310, the photoelectric conversion layer 320, the transparent electrode layer 330, the insulating optical spacer 340a, and a semi-permeable metal layer 350d. The photoelectric conversion device 2a may further include the passivation layer 360 and the plurality of microlenses 370.

The insulating optical spacer 340a may have the trench 340Ra. The trench 340Ra may extend along edges of the plurality of microlenses 370 in a plan view. The trench 340Ra may be arranged to overlap the edge of the plurality of microlenses 370 in the vertical direction. The trench 340Ra may be disposed on the plurality of pixel regions, such as the first and second pixel regions PX1 and PX2, and may extend therebetween.

The semi-permeable metal layer 350d may be formed on the insulating optical spacer 340a. The semi-permeable metal layer 350d may be formed to conformally cover the insulating optical spacer 340a. A portion of the trench 340Ra of the insulating optical spacer 340a may be filled with a light blocking wall 350Ed conformally covering an inner sidewall and a bottom surface of the trench 340Ra. As shown in the embodiment of FIG. 5, the light blocking wall 350Ed may not entirely fill the trench 340Ra. The light blocking wall 350Ed may include the same material as the semi-permeable metal layer 350d. The light blocking wall 350Ed and the semi-permeable metal layer 350d may be formed together to be one integrated body, and the light blocking wall 350Ed may be a portion of the integrated body for filling a portion of the trench 340Ra and the semi-permeable metal layer 350d may be a portion of the integrated body for covering the top surface of the insulating optical spacer 340a except the trench 340Ra. The semi-permeable metal layer 350d may have the sixth thickness T6.

The semi-permeable metal layer 350d may have semi-permeability for light of the wavelength band to be detected by the photoelectric conversion device 2a. For example, in an embodiment, the light transmittance of the semi-permeable metal layer 350d may be in a range of about 30% to about 70% for the light of the wavelength band to be detected by the photoelectric conversion device 2a.

A passivation layer 360c may be formed on the semi-permeable metal layer 350d and the light blocking wall 350Ed. The passivation layer 360c may have an extension buried portion 360Ec that entirely fills a remaining portion of the trench 340Ra, such as the remaining portion of the trench 340Ra that is not filled with the light blocking wall 350Ed. As shown in the embodiment of FIG. 5, the remaining portion of the trench 340Ra that is not filled by the light blocking wall 350Ed may be in a central portion of the trench 340Ra in a direction parallel to an upper surface of the substrate 100.

Light L2, which is a portion of light L1 incident on the photoelectric conversion device 2a through the microlenses 370, may be reflected on the semi-permeable metal layer 350d and released to the outside of the photoelectric conversion device 2a, and light L3 which a remaining portion of light L1 may pass through the semi-permeable metal layer 350d and enter the stacked structure ST. The light L3 incident into the stacked structure ST may be repeatedly reflected between the reflective layer 310 and the semi-permeable metal layer 350d, and light L4 which is a portion of light L3 may pass through the semi-permeable metal layer 350d to be released to the outside and the remaining portion of light L3 may be reflected towards the reflective layer 310. The light blocking wall 350Ed may extend between the plurality of pixel regions, such as the first and second pixel regions PX1 and PX2, so that the light incident on one pixel region, for example, the first pixel region PX1, may be blocked to enter an adjacent pixel region, for example, the second pixel region PX2. Therefore, the light blocking wall 350Ed may prevent optical interference from occurring between adjacent pixels of the plurality of pixels of the photoelectric conversion device 2a, thereby increasing the light detection resolution of the photoelectric conversion device 2a.

Figure 6A:
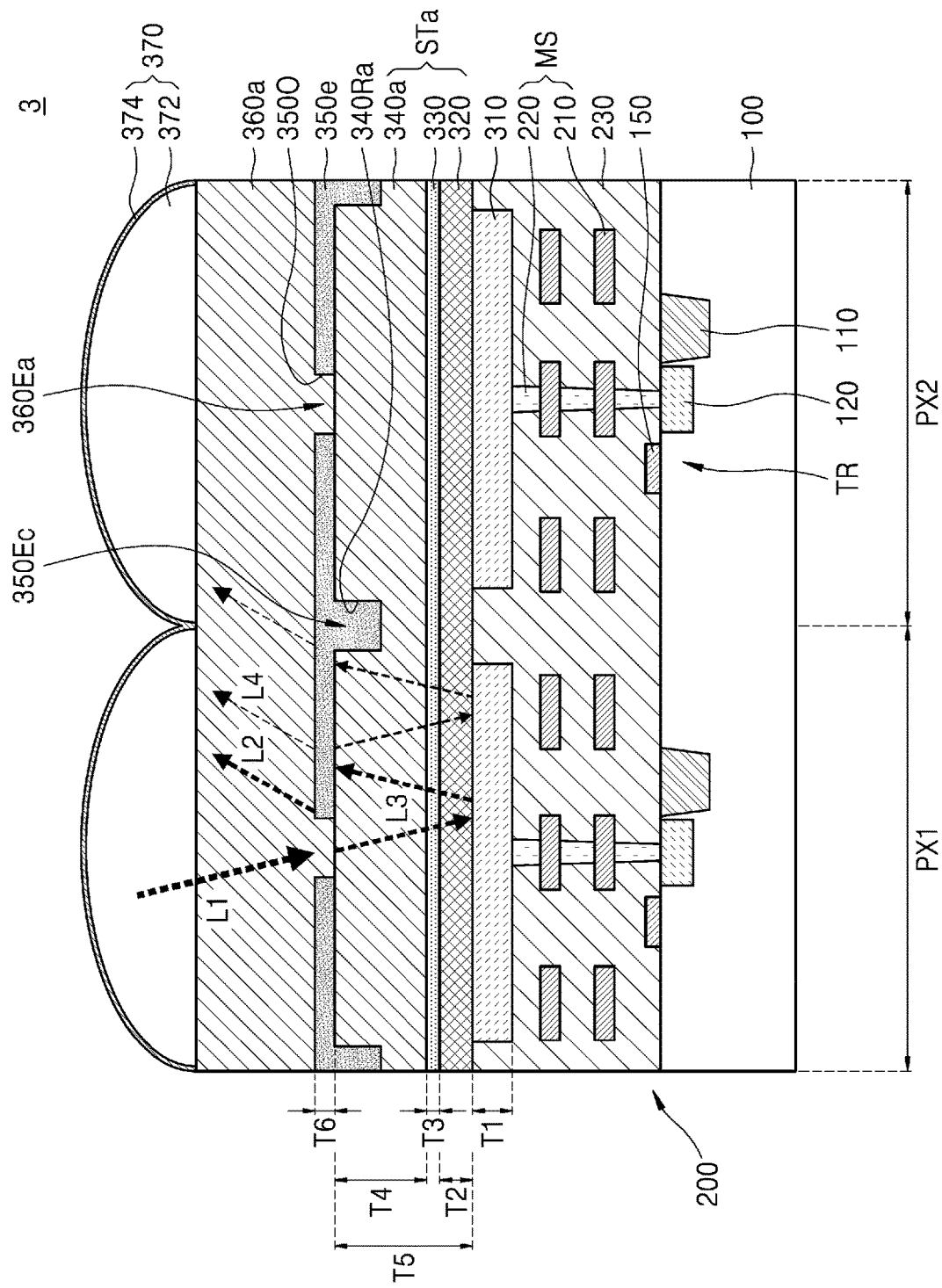
FIGS. 6A and 6B are cross-sectional views illustrating main parts of a photoelectric conversion device according to embodiments of the present inventive concepts.
Figure 6B:
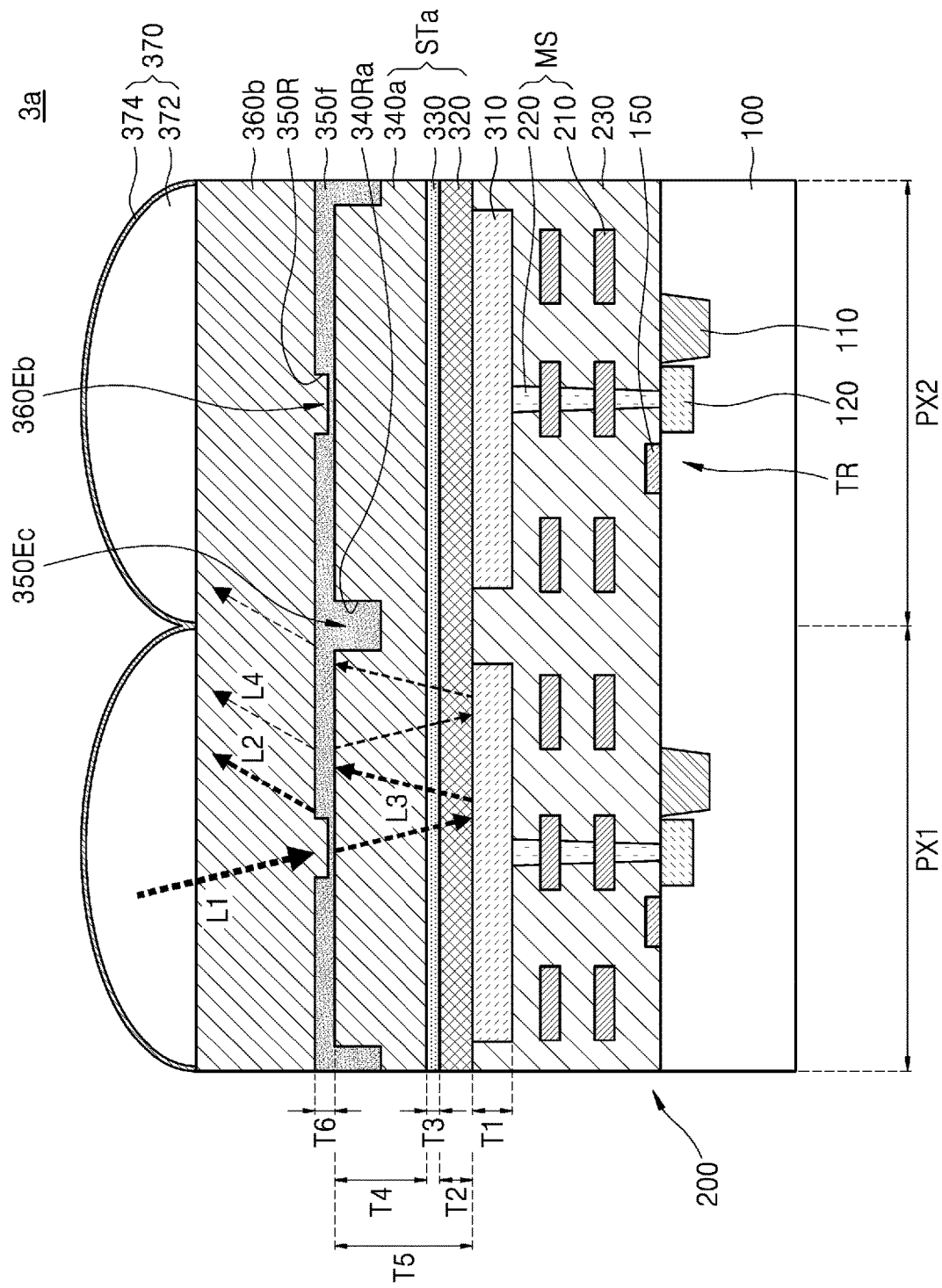

FIGS. 6A and 6B are cross-sectional views illustrating main parts of a photoelectric conversion device according to embodiments of the present inventive concept. In FIGS. 6A and 6B, the same reference numerals as in FIGS. 1 to 5 denote the same components, and the duplicate descriptions thereof are omitted for convenience of explanation.

Referring to FIG. 6A, a photoelectric conversion device 3 may include the substrate 100, the wiring layer 200, the plurality of reflective layers 310, the photoelectric conversion layer 320, the transparent electrode layer 330, the insulating optical spacer 340a, and a semi-permeable metal layer 350e. The photoelectric conversion device 3 may further include the passivation layer 360a and the plurality of microlenses 370.

The insulating optical spacer 340a may have the trench 340Ra. The trench 340Ra may be arranged to overlap the edge of the plurality of microlenses 370 in the vertical direction. The trench 340Ra may be disposed on the plurality of pixel regions, such as the first and second pixel regions PX1 and PX2 and may extend therebetween.

The semi-permeable metal layer 350e may be formed on the insulating optical spacer 340a. The semi-permeable metal layer 350e may cover a portion of the insulating optical spacer 340a. The trench 340Ra may be filled by the light blocking wall 350Ec. The semi-permeable metal layer 350e may include the plurality of openings 350O. The plurality of openings 350O may fully penetrate the semi-permeable metal layer 350e, and thus, the insulating optical spacer 340a may be exposed on the bottom surface of the plurality of openings 350O. The plurality of openings 350O may be in the center portion of the plurality of microlenses 370 in a plan view (e.g., in a direction parallel to an upper surface of the substrate 100). The plurality of openings 350O may be arranged to overlap the center portion of the plurality of microlenses 370 in the vertical direction.

The semi-permeable metal layer 350e may have the sixth thickness T6. The semi-permeable metal layer 350e may have semi-permeability for light of the wavelength band to be detected by the photoelectric conversion device 3. For example, in an embodiment, the light transmittance of the semi-permeable metal layer 350e may be in a range of about 30% to about 70% for the light of the wavelength band to be detected by the photoelectric conversion device 3.

The passivation layer 360a may be formed on the semi-permeable metal layer 350e and the light blocking wall 350Ec. The passivation layer 360a may fill the plurality of openings 350O and have a plurality of extension portions 360Ea extending toward the insulating optical spacer 340a. Each of the plurality of extension portions 360Ea of the passivation layer 360a may directly contact the insulating optical spacer 340a.

The photoelectric conversion device 3 according to an embodiment of the present inventive concepts may have the light blocking wall 350Ec and the plurality of openings 350O, so that light detection resolution and light conversion efficiency may be increased.

Referring to FIG. 6B, a photoelectric conversion device 3a may include the substrate 100, the wiring layer 200, the plurality of reflective layers 310, the photoelectric conversion layer 320, the transparent electrode layer 330, the insulating optical spacer 340a, and a semi-permeable metal layer 350f. The photoelectric conversion device 3a may further include the passivation layer 360b and the plurality of microlenses 370.

The insulating optical spacer 340a may have the trench 340Ra. The trench 340Ra may be arranged to overlap the edges of the plurality of microlenses 370 in the vertical direction. The trench 340Ra may be disposed on the plurality of pixel regions, such as the first and second pixel regions PX1, PX2 and may extend therebetween.

The semi-permeable metal layer 350f may be formed on the insulating optical spacer 340a (e.g., directly thereon in a thickness direction of the substrate 100). The semi-permeable metal layer 350f may cover the insulating optical spacer 340a. The trench 340Ra may be filled by the light blocking wall 350Ec. The semi-permeable metal layer 350f may have the plurality of recesses 350R. The plurality of recesses 350R may extend toward the bottom surface of the semi-permeable metal layer 350f. The plurality of recesses 350R may not fully penetrate the semi-permeable metal layer 350f. The plurality of recesses 350R may be in the center portion of the plurality of microlenses 370 in a plan view (e.g., in a direction parallel to an upper surface of the substrate 100). The plurality of recesses 350R may be arranged to overlap the center portion of the plurality of microlenses 370 in the vertical direction (e.g., a direction parallel to a thickness direction of the substrate 100).

The insulating optical spacer 340a may not be exposed on the bottom surface of the plurality of recesses 350R and a portion of the semi-permeable metal layer 350f may be exposed. The portion of the semi-permeable metal layer 350f exposed on the bottom surface of the plurality of recesses 350R may have a relatively thin thickness. The portion of the semi-permeable metal layer 350f exposed on the bottom surface of the plurality of recesses 350R may have a light transmittance greater than a remaining portion of the semi-permeable metal layer 350f. The semi-permeable metal layer 350f may have the sixth thickness T6 in the remaining portion, except for a portion of the semi-permeable metal layer 350f exposed at the bottom surface of the plurality of recesses 350R. The portion of the semi-permeable metal layer 350f exposed on the bottom surface of the plurality of recesses 350R may have a thickness that is less than the sixth thickness T6.

The passivation layer 360b may be formed on the semi-permeable metal layer 350f and the light blocking wall 350Ec (e.g., directly thereon in a thickness direction of the substrate 100). The passivation layer 360b may fill the plurality of recesses 350R and have the plurality of extension portions 360Eb extending toward the insulating optical spacer 340a. Each of the plurality of extension portions 360Eb of the passivation layer 360b may be spaced apart from the insulating optical spacer 340 without contacting the optical spacer 340. For example, as shown in the embodiment of FIG. 6B, the exposed portion of the plurality of recesses 350R may be interposed between the insulating optical spacer 340a and the plurality of extension portions 360Eb in a thickness direction of the substrate 100.

The photoelectric conversion device 3a according to an embodiment of the present inventive concepts may have the light blocking wall 350Ec and the plurality of recesses 350R, so that light detection resolution and light conversion efficiency may be increased.

Figure 7A:
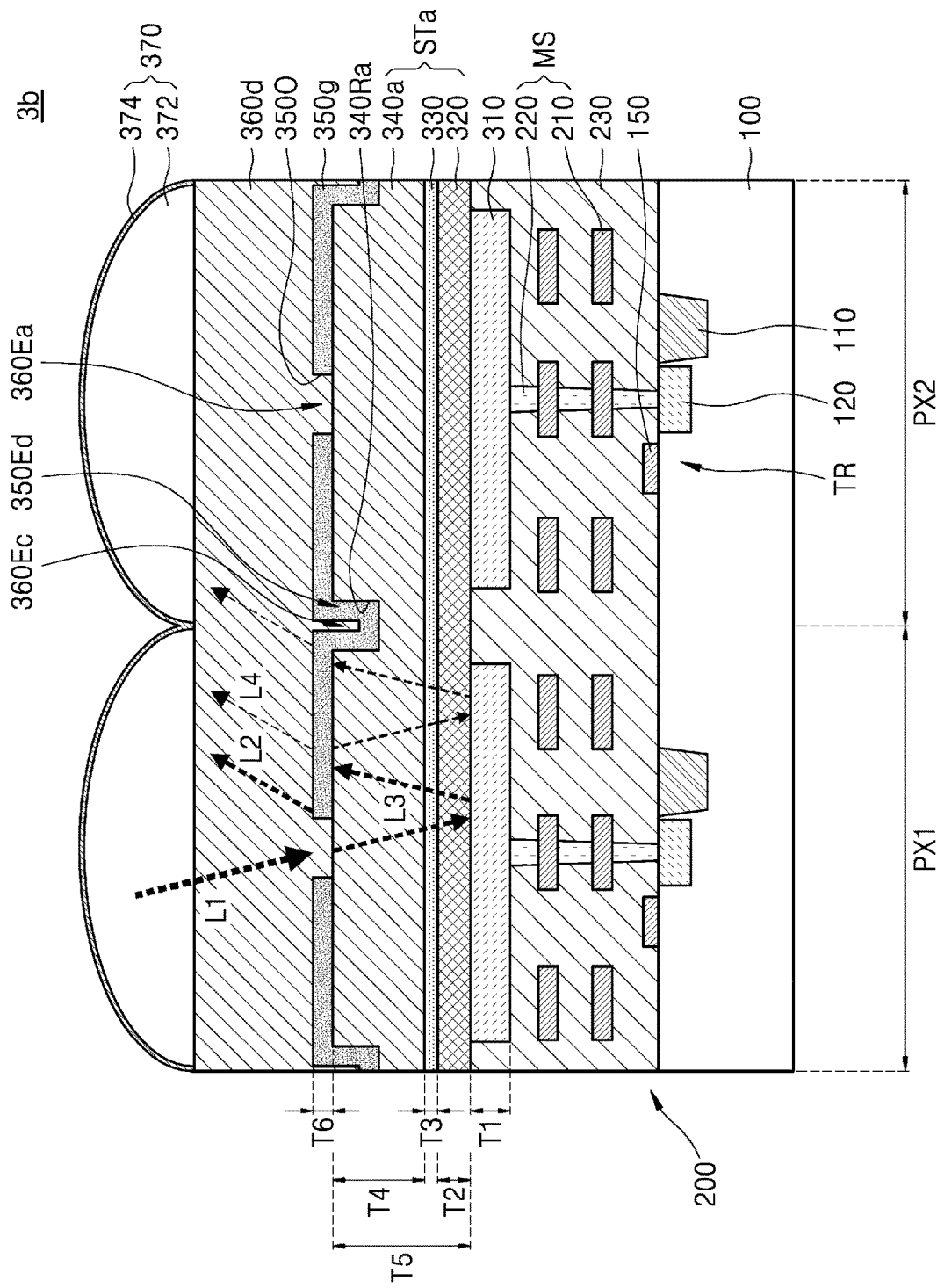
FIGS. 7A and 7B are cross-sectional views illustrating main parts of a photoelectric conversion device according to embodiments of the present inventive concepts.
Figure 7B:
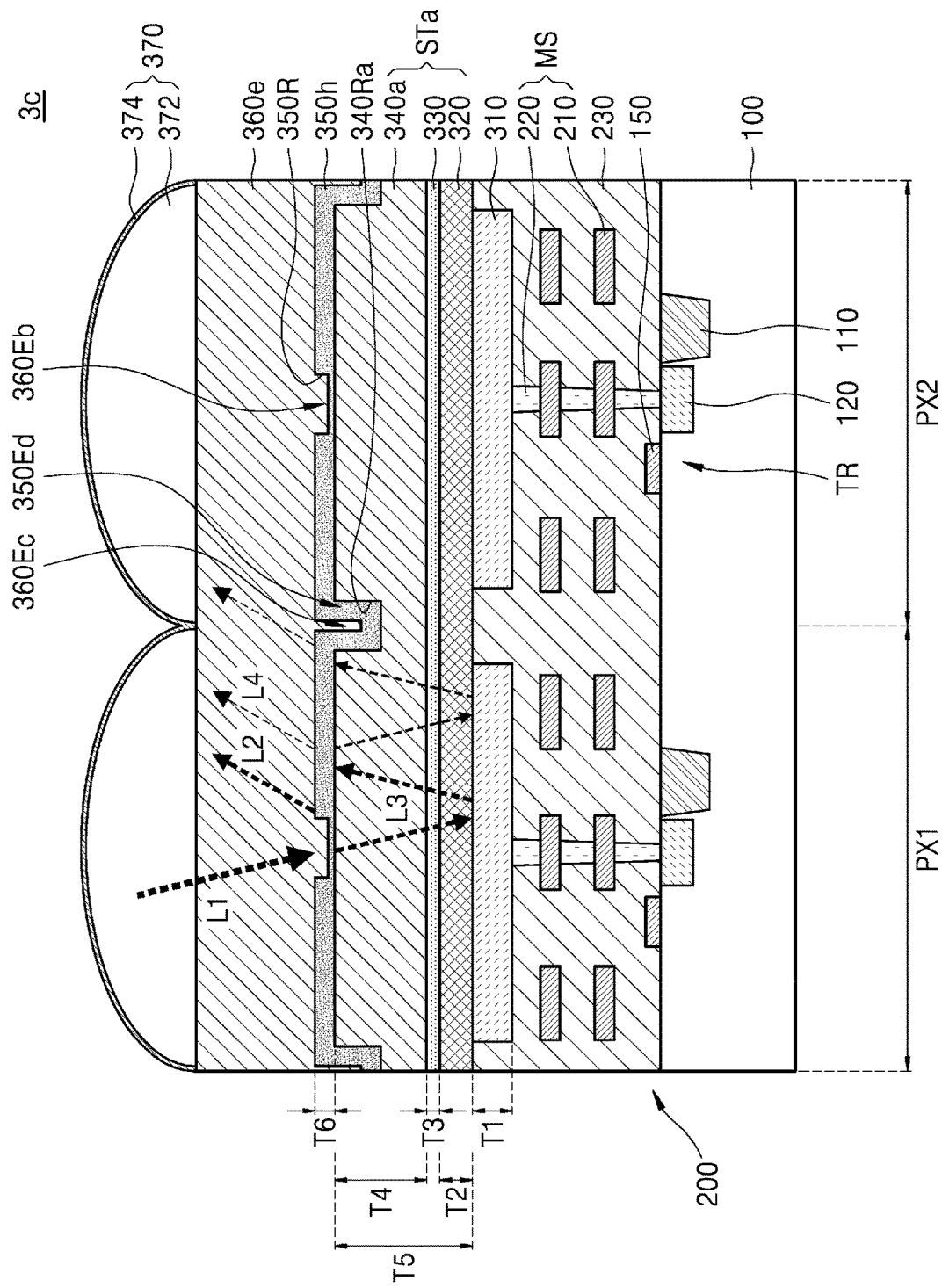

FIGS. 7A and 7B are cross-sectional views illustrating main parts of a photoelectric conversion device according to embodiments of the present inventive concepts. In FIGS. 7A and 7B, the same reference numerals as in FIGS. 1 to 6B denote the same components, and the duplicate descriptions thereof are omitted for convenience of explanation.

Referring to FIG. 7A, the photoelectric conversion device 3b may include the substrate 100, the wiring layer 200, the plurality of reflective layers 310, the photoelectric conversion layer 320, the transparent electrode layer 330, the insulating optical spacer 340a, and a semi-permeable metal layer 350g. The photoelectric conversion device 3b may further include the passivation layer 360d and the plurality of microlenses 370.

The insulating optical spacer 340a may have the trench 340Ra. The trench 340Ra may be arranged to overlap the edges of the plurality of microlenses 370 in the vertical direction (e.g., in a direction parallel to a thickness direction of the substrate 100). The trench 340Ra may be disposed on the plurality of pixel regions, such as the first and second pixel regions PX1, PX2 and may extend therebetween.

The semi-permeable metal layer 350g may be formed on the insulating optical spacer 340a. The semi-permeable metal layer 350g may cover a portion of the insulating optical spacer 340a. A portion of the trench 340Ra may be filled by the light blocking wall 350Ed. The semi-permeable metal layer 350g may include the plurality of openings 350O. The plurality of openings 350O may fully penetrate the semi-permeable metal layer 350g, and thus, the insulating optical spacer 340a may be exposed on the bottom surface of the plurality of openings 350O. The plurality of openings 350O may be in the center portion of the plurality of microlenses 370 in a plan view (e.g., in a direction parallel to an upper surface of the substrate 100). The plurality of openings 350O may be arranged to overlap the center portion of the plurality of microlenses 370 in the vertical direction (e.g., in a direction parallel to a thickness direction of the substrate 100).

The semi-permeable metal layer 350g may have the sixth thickness T6. The semi-permeable metal layer 350g may have semi-permeability for light of the wavelength band to be detected by the photoelectric conversion device 3b. For example, in an embodiment, the light transmittance of the semi-permeable metal layer 350g may be in a range of about 30% to about 70% for the light of the wavelength band to be detected by the photoelectric conversion device 3b.

A passivation layer 360d may be formed on the semi-permeable metal layer 350g and the light blocking wall 350Ed (e.g., directly thereon in a thickness direction of the substrate 100). The passivation layer 360d may include the plurality of extension portions 360Ea that fill the plurality of openings 350O and extend toward the insulating optical spacer 340a, and the extended buried portion 360Ec that entirely fills the remaining portion of the trench 340Ra which is not filled by the light blocking wall 350Ed. Each of the plurality of extension portions 360Ea of the passivation layer 360d may directly contact the insulating optical spacer 340a.

The photoelectric conversion device 3b according to an embodiment of the present inventive concepts may have the light blocking wall 350Ed and the plurality of openings 350O, so that light detection resolution and light conversion efficiency may be increased.

Referring to FIG. 7B, the photoelectric conversion device 3c may include the substrate 100, the wiring layer 200, the plurality of reflective layers 310, the photoelectric conversion layer 320, the transparent electrode layer 330, the insulating optical spacer 340a, and a semi-permeable metal layer 350h. The photoelectric conversion device 3c may further include the passivation layer 360e and the plurality of microlenses 370.

The insulating optical spacer 340a may have the trench 340Ra. The trench 340Ra may be arranged to overlap the edges of the plurality of microlenses 370 in the vertical direction (e.g., in a direction parallel to a thickness direction of the substrate 100). The trench 340Ra may be disposed on the plurality of pixel regions, such as the first and second pixel regions PX1 and PX2 and may extend therebetween.

The semi-permeable metal layer 350h may be formed on the insulating optical spacer 340a (e.g., directly thereon in a thickness direction of the substrate 100). The semi-permeable metal layer 350h may cover the insulating optical spacer 340a. A portion of the trench 340Ra may be filled by the light blocking wall 350Ed. The semi-permeable metal layer 350h may have the plurality of recesses 350R. The plurality of recesses 350R may extend toward the bottom surface of the semi-permeable metal layer 350h. The plurality of recesses 350R may not fully penetrate the semi-permeable metal layer 350h. The plurality of recesses 350R may be in the center portion of the plurality of microlenses 370 in a plan view (e.g., in a horizontal direction parallel to an upper surface of the substrate 100). The plurality of recesses 350R may be arranged to overlap the center portion of the plurality of microlenses 370 in the vertical direction (e.g., in a direction parallel to a thickness direction of the substrate 100).

The insulating optical spacer 340a may be not exposed on the bottom surface of the plurality of recesses 350R and a portion of the semi-permeable metal layer 350h may be exposed. The portion of the semi-permeable metal layer 350h exposed on the bottom surface of the plurality of recesses 350R may have a relatively thin thickness. The portion of the semi-permeable metal layer 350h exposed on the bottom surface of the plurality of recesses 350R may have a light transmittance greater than a remaining portion of the semi-permeable metal layer 350h. The semi-permeable metal layer 350h may have the sixth thickness T6 in the remaining portion, except a portion of the semi-permeable metal layer 350h exposed at the bottom surface of the plurality of recesses 350R. The portion of the semi-permeable metal layer 350h exposed on the bottom surface of the plurality of recesses 350R may have a thickness less than the sixth thickness T6.

A passivation layer 360e may be formed on the semi-permeable metal layer 350h and the light blocking wall 350Ed (e.g., directly thereon in a thickness direction of the substrate 100). The passivation layer 360e may include the plurality of extension portions 360Eb that fill the plurality of recesses 350R and extend toward the insulating optical spacer 340a, and the extended buried portion 360Ec that entirely fills the remaining portion of the trench 340Ra that is not filled by the light blocking wall 350Ed. The passivation layer 360e may be spaced apart from the insulating optical spacer 340a without contacting the insulation optical spacer 340a.

The photoelectric conversion device 3c according to an embodiment of the present inventive concepts may have the light blocking wall 350Ed and the plurality of recesses 350R, so that light detection resolution and light conversion efficiency may be increased.

Figure 8:
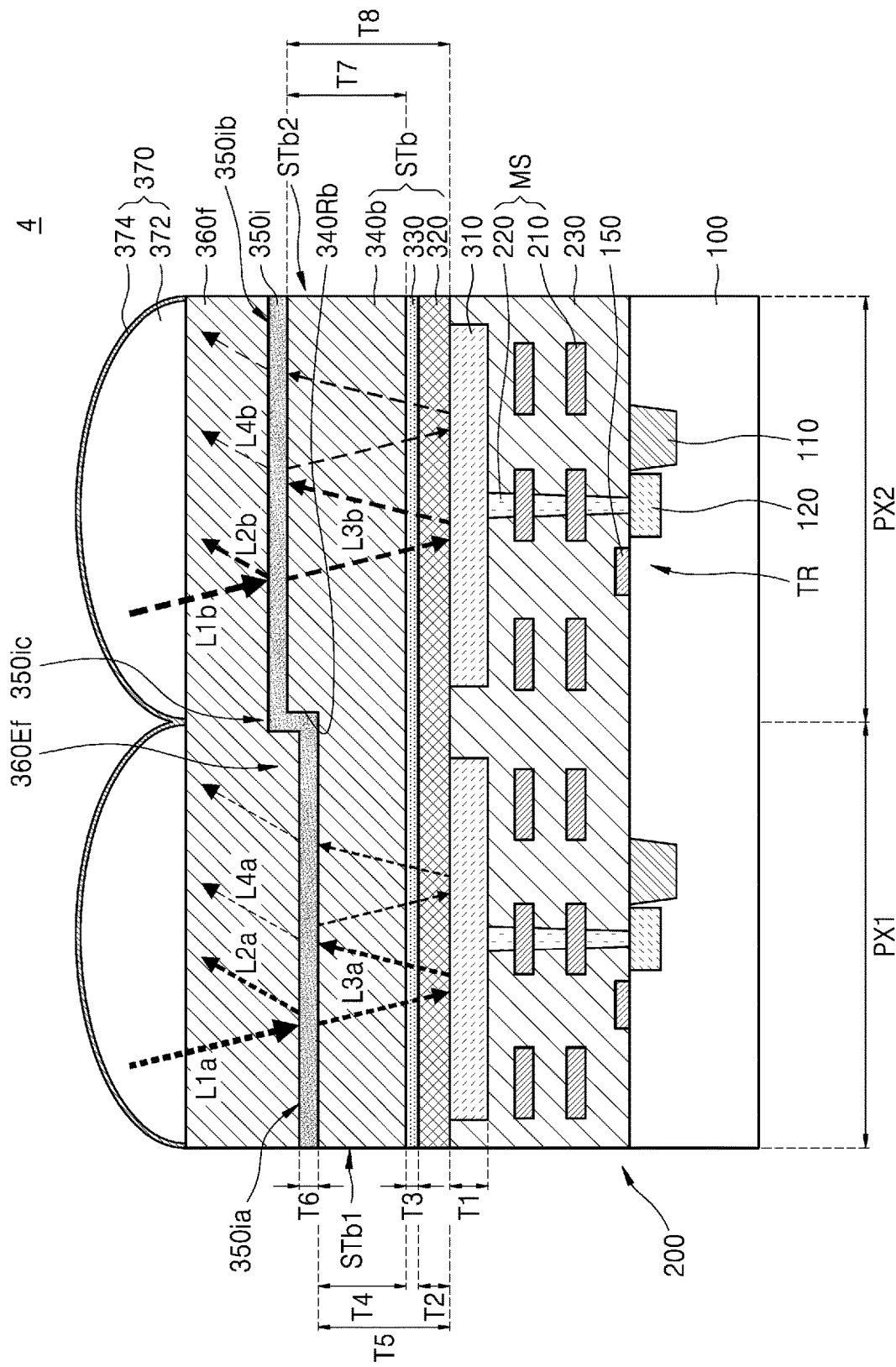
FIG. 8 is a cross-sectional view illustrating main parts of a photoelectric conversion device according to an embodiment of the present inventive concepts.

FIG. 8 is a cross-sectional view illustrating main parts of a photoelectric conversion device according to an embodiment of the present inventive concepts. In FIG. 8, the same reference numerals as in FIGS. 1 to 7B denote the same components, and the duplicate descriptions thereof are omitted for convenience of explanation.

Referring to the embodiment of FIG. 8, the photoelectric conversion device 4 may include the substrate 100, the wiring layer 200, the plurality of reflective layers 310, the photoelectric conversion layer 320, the transparent electrode layer 330, an insulating optical spacer 340b, and a semi-permeable metal layer 350i. A stacked structure STb may include the photoelectric conversion layer 320, the transparent electrode layer 330, and an insulating optical spacer 340b. The photoelectric conversion device 4 may further include the passivation layer 360f and the plurality of microlenses 370.

The insulating optical spacer 340b may have at least one pixel recess 340Rb. In an embodiment, each of the at least one pixel recesses 340Rb may be formed to correspond to at least one pixel region of the plurality of the plurality of pixel regions, respectively, such as the first pixel region PX1 and/or the second pixel region PX2. The at least one pixel recess 340Rb may be formed by forming the insulating optical spacer 340b to have a relatively lower top surface over the entire pixel region of at least one of the plurality of pixel regions, such as the first and/or second pixel regions PX1, PX2. For example, as shown in the embodiment of FIG. 8, the pixel recess 340Rb may be formed to correspond to the first pixel region PX1, and the top surface of a portion of the insulating optical spacer 340b disposed in the first pixel region PX1 may be disposed at a lower vertical level than the top surface of the other portion of the insulating optical spacer 340b disposed in the second pixel region PX2. However, embodiments of the present inventive concepts are not limited thereto.

The insulating optical spacer 340b may have the fourth thickness T4 in the portion where the at least one pixel recess 340Rb is formed, and may have a seventh thickness 17 in the remaining other portion. The seventh thickness T7 may be greater than the fourth thickness T4. A first stacked portion STb1, which is the portion which includes the at least one pixel recess 340Rb among the stacked structure STb that is formed of the photoelectric conversion layer 320, the transparent electrode layer 330, and the insulating optical spacer 340b, may have the fifth thickness T5, and a second stacked portion STb2, which is the remaining portion that does not include the at least one pixel recess 340Rb, may have an eighth thickness T8. The eighth thickness T8 may be greater than the fifth thickness T5.

A semi-permeable metal layer 350i may be formed on the insulating optical spacer 340b (e.g., directly thereon in a thickness direction of the substrate 100). The semi-permeable metal layer 350i may cover the insulating optical spacer 340b. In some embodiments, the semi-permeable metal layer 350i may be conformally formed to have the sixth thickness T6, which is generally the same thickness in each of the first pixel region PX1 and the second pixel region PX2. The semi-permeable metal layer 350i may have a third portion 350ic on a side surface of the pixel recess 340Rb having a thickness that is greater than the sixth thickness T6. For example, the semi-permeable metal layer 350i may conformally cover a bottom surface and inner side walls of the pixel recess 340Rb. In some embodiments, the semi-permeable metal layer 350i may be formed so as not to entirely fill the pixel recess 340Rb.

The semi-permeable metal layer 350i may include a first portion 350ia covering the bottom surface of the pixel recess 340Rb. For example, the semi-permeable metal layer 350i may cover a top surface of the insulating optical spacer 340b that is located at a relatively lower vertical level due to the pixel recess 340Rb as compared to the semi-permeable metal layer 350i disposed in another pixel region. The semi-permeable metal layer 350i may include a second portion 350ib covering the top surface of the insulating optical spacer 340b in a region other than the pixel recess 340Rb. The second portion 350ib is located at a relatively higher vertical level than the first portion 350ia. The semi-permeable metal layer 350i includes a third portion 350ic covering a side surface of the pixel recess 340Rb which extends from the first portion 350ia to the second portion 350ib.

The semi-permeable metal layer 350i may have semi-permeability for light of the wavelength band to be detected by the photoelectric conversion device 4. For example, in an embodiment, the light transmittance of the semi-permeable metal layer 350i may be in a range of about 30% to about 70% for the light of the wavelength band to be detected by the photoelectric conversion device 4.

The passivation layer 360f may be formed on the semi-permeable metal layer 350i (e.g., directly thereon in a thickness direction of the substrate 100). The passivation layer 360f may have an extension buried portion 360Ef that entirely fills a remaining portion of the pixel recesses 340Rb, that is not filled with the semi-permeable metal layer 350i.

Light L2a, which is a portion of light L1a incident on the first pixel region PX1 of the photoelectric conversion device 4 through the microlens 370, may be reflected on the first portion 350ia of the semi-permeable metal layer 350i that covers the bottom surface of the pixel recess 340Rb and released to the outside of the photoelectric conversion device 4, and light L3a which is a remaining portion of light L1a may pass through the first portion 350ia of the semi-permeable metal layer 350i and enter the first stacked portion STb1 of the stacked structure STb. Light L2b, which is a portion of light L1b incident on the second pixel region PX2 of the photoelectric conversion device 4 through the microlens 370, may be reflected on the second portion 350ib of the semi-permeable metal layer 350i and released to the outside of the photoelectric conversion device 4, and light L3b which is a remaining portion of light L1b may pass through the second portion 350ib of the semi-permeable metal layer 350i and enter the second stacked portion STb2 of the stacked structure STb. The third portion 350ic of the semi-permeable metal layer 350i may prevent optical interference from occurring between the plurality of pixels of the photoelectric conversion device 4.

The first stacked portion STb1 may have the fifth thickness T5 and the second stacked portion STb2 may have the eighth thickness T8 greater than the fifth thickness T5, so that light having a wavelength corresponding to the fifth thickness T5 among light L3a which is a remaining portion of the first light L1a incident on the first stacked portion STb1 may cause a resonance in the first stacked portion STb1, and the light having a wavelength corresponding to the eighth thickness T8 of light L3b which is a remaining portion of the second light L1b incident on the second stacked portion STb2 may cause the resonance in the second stacked portion STb2.

Accordingly, the photoelectric conversion device 4 according to an embodiment of the present inventive concepts may increase the light conversion efficiency and the light detection resolution, and perform the function of the multi-spectrum photoelectric conversion device capable of detecting light having other wavelength bands.

FIGS. 9A, 9B, 10A, 10B, 11, 12A, and 12B are cross-sectional views illustrating a method of manufacturing a photoelectric conversion device according to embodiments of the inventive concept. In FIGS. 9A, 9B, 10A, 10B, 11, 12A and 12B, the same reference numerals as in FIGS. 1 to 7B denote the same components, and the duplicate descriptions thereof are omitted.

Figure 9A:
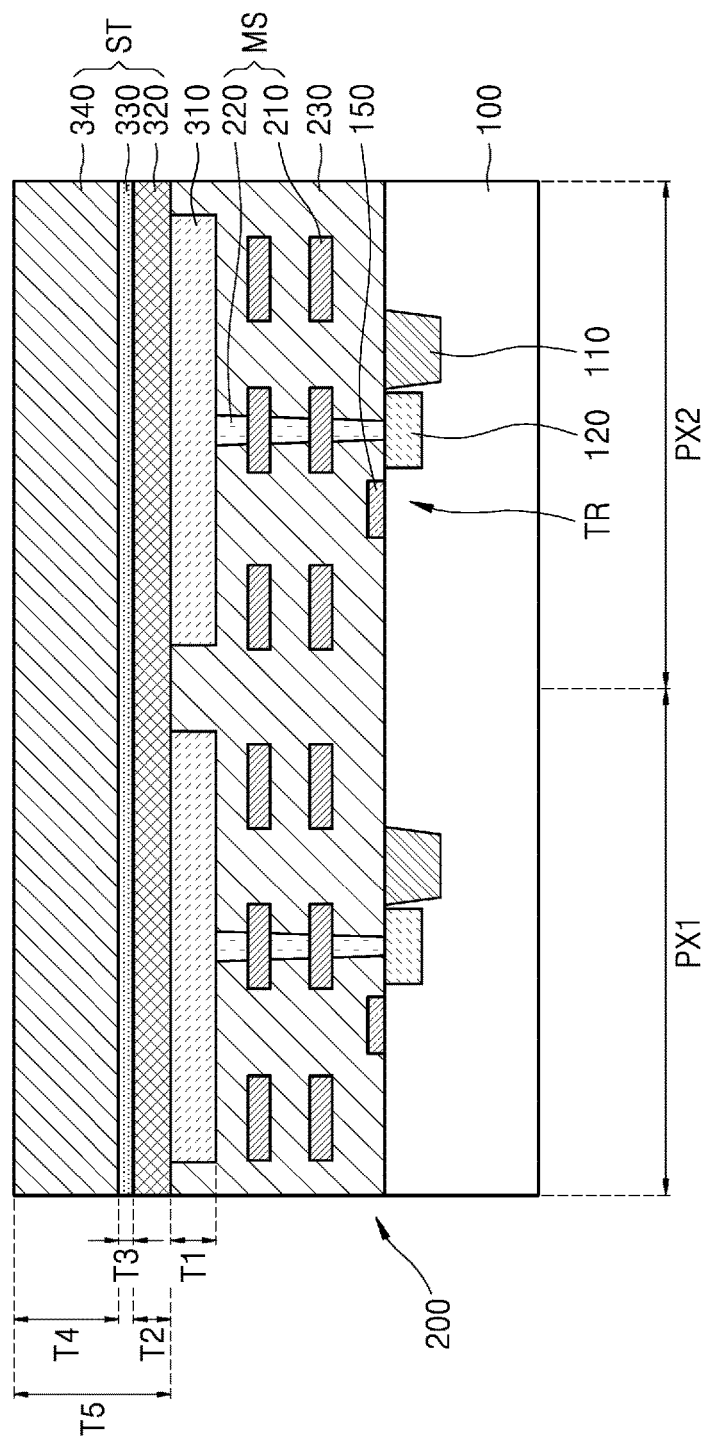
FIGS. 9A, 9B, 10A, 10B, 11, 12A, and 12B are cross-sectional views illustrating a method of manufacturing a photoelectric conversion device according to embodiments of the present inventive concepts.

Referring to FIG. 9A, the wiring layer 200 and the plurality of reflective layers 310 may be sequentially formed on the substrate 100, and the photoelectric conversion layer 320, the transparent electrode layer 330 and the insulating optical spacer 340 may be sequentially formed on the plurality of reflective layers 310 to form the stacked structure ST.

Figure 9B:
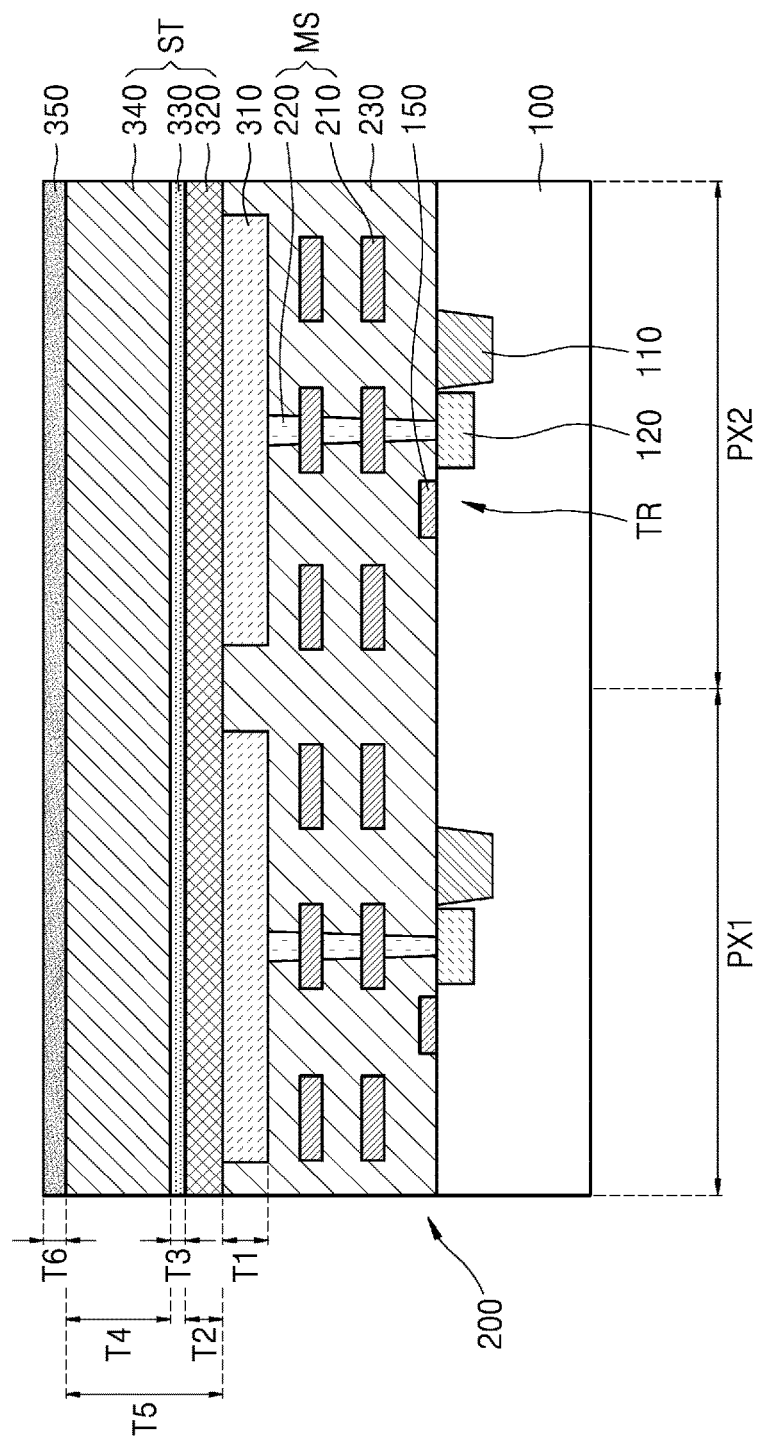

Referring to FIG. 9B, the semi-permeable metal layer 350 covering the stacked structure ST may be formed. As shown in FIG. 1, the passivation layer 360 and the plurality of microlenses 370 may be subsequently disposed thereon to form the photoelectric conversion device 1.

Figure 10A:
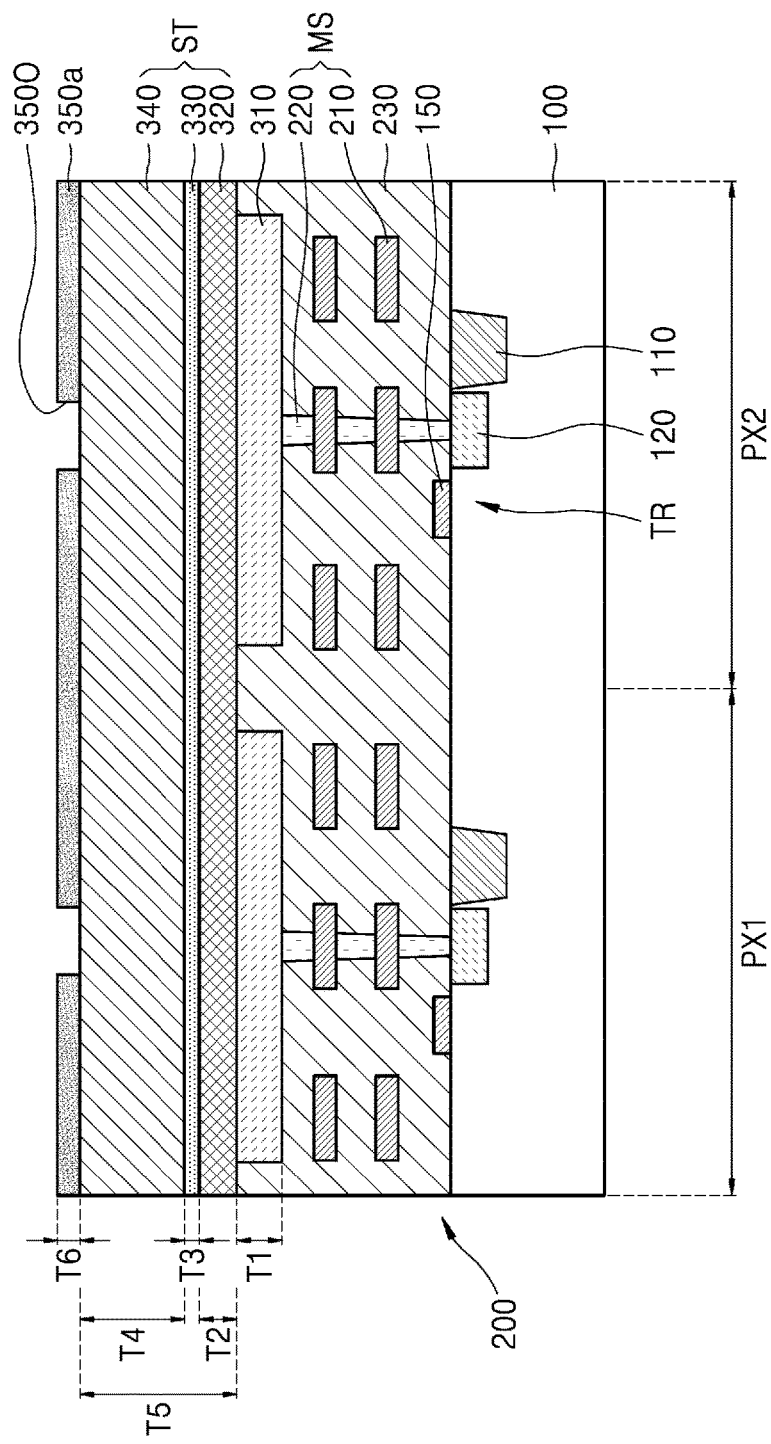

Referring to FIG. 10A, a portion of the semi-permeable metal layer 350 shown in FIG. 9B may be removed to form the semi-permeable metal layer 350a having the plurality of openings 3500, through which the top surface of the insulating optical spacer 340 is exposed. As shown in FIG. 2A, the passivation layer 360a and the plurality of microlenses 370 may subsequently disposed thereon to form the photoelectric conversion device 1a.

Figure 10B:
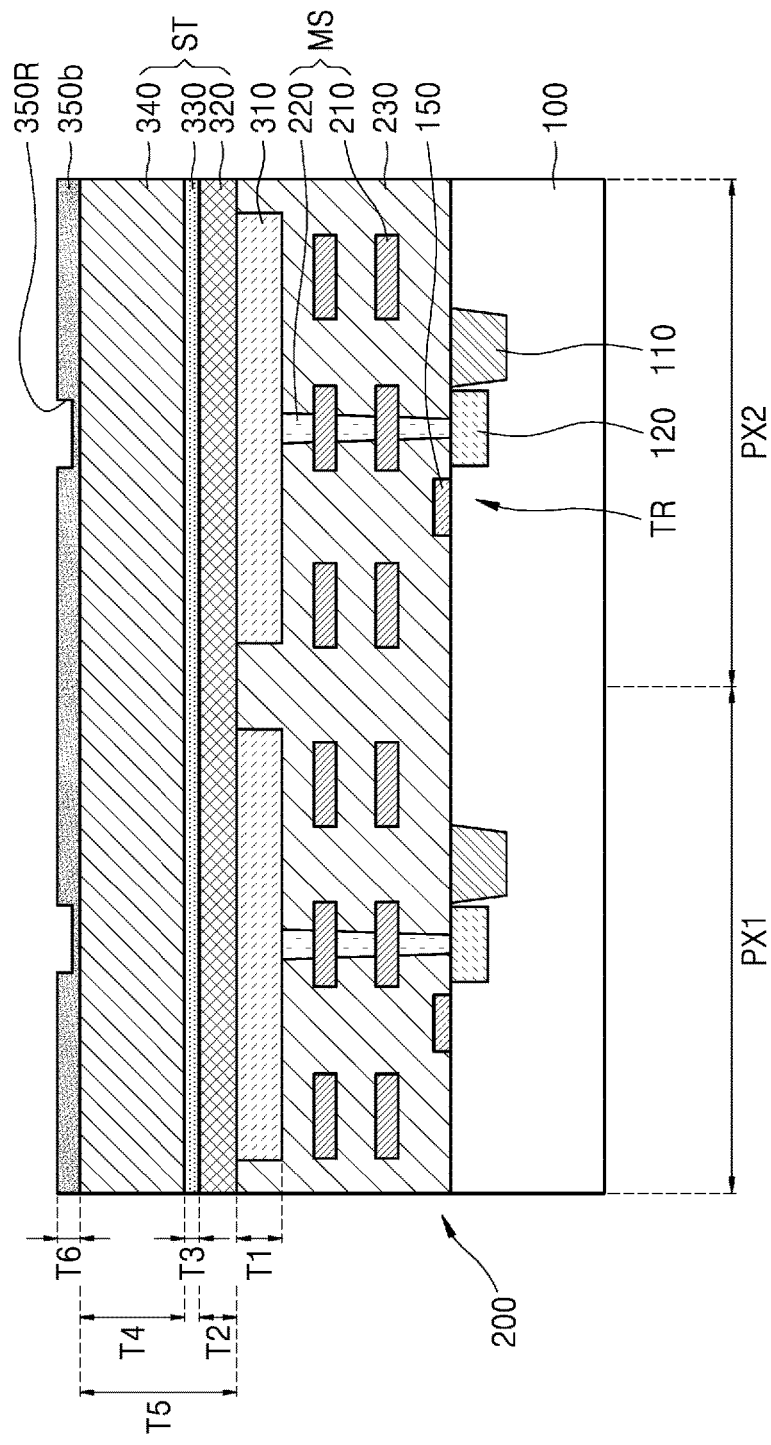

Referring to FIG. 10B, a portion of the semi-permeable metal layer 350 shown in FIG. 9B may be removed to form the semi-permeable metal layer 350b having the plurality of recesses 350R, through which the top surface of the insulating optical spacer 340 is not exposed. As shown in FIG. 3A, the passivation layer 360 and the plurality of microlenses 370 may subsequently disposed thereon to form the photoelectric conversion device 1b.

Figure 11:
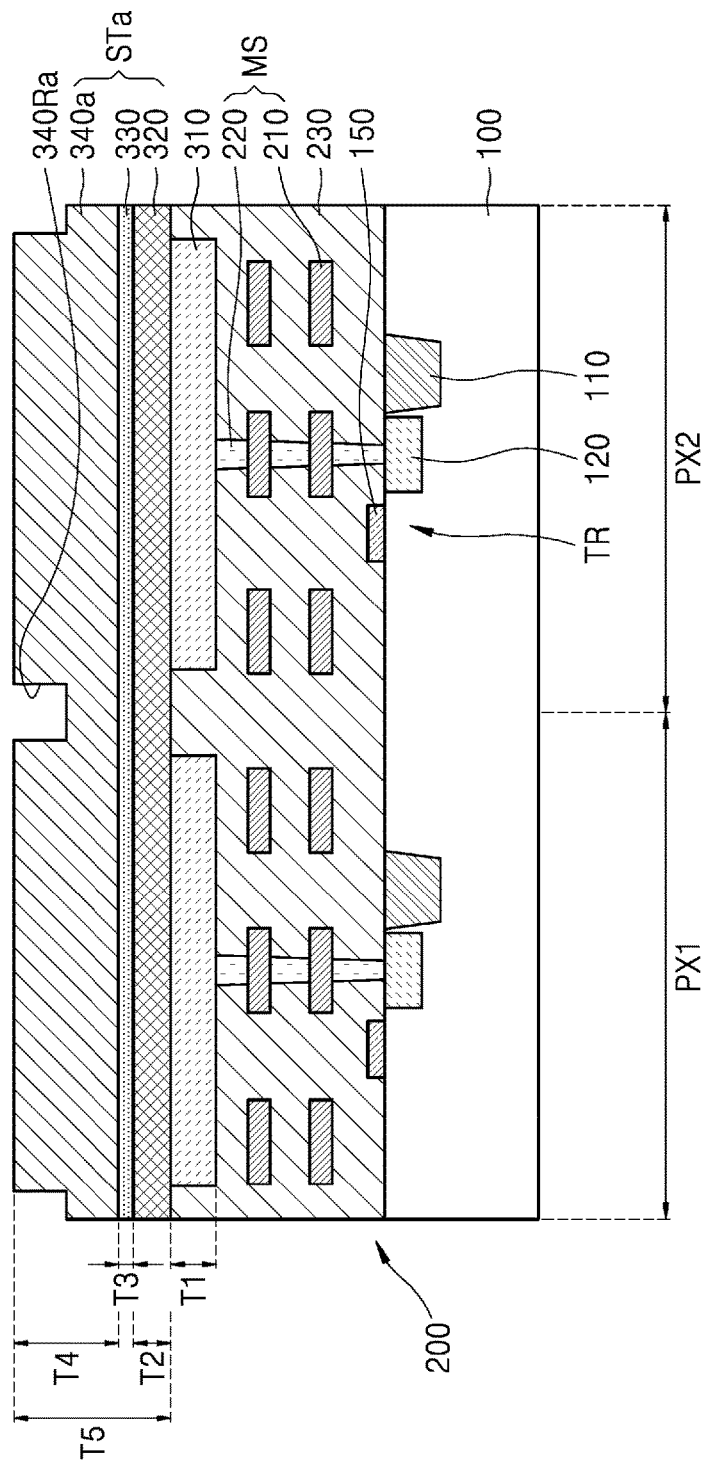

Referring to FIG. 11, a portion of the insulating optical spacer 340 shown in FIG. 9A may be removed to form the insulating optical spacer 340a having the trench 340Ra. As shown in FIG. 4A, the semi-permeable metal layer 350c having the light blocking wall 350Ec that fills the trench 340Ra, the passivation layer 360b, and the plurality of microlens 370 may be subsequently disposed thereon to form the photoelectric conversion device 2. In an embodiment, as shown in FIG. 5, the semi-permeable metal layer 350d having the light blocking wall 350Ed that fills a portion of the trench 340Ra, the passivation layer 360c having the extension buried portion 360Ec that entirely fills the remaining portion of the trench 340Ra, and the plurality of microlens 370 may be subsequently disposed thereon to form the photoelectric conversion device 2a.

Figure 12A:
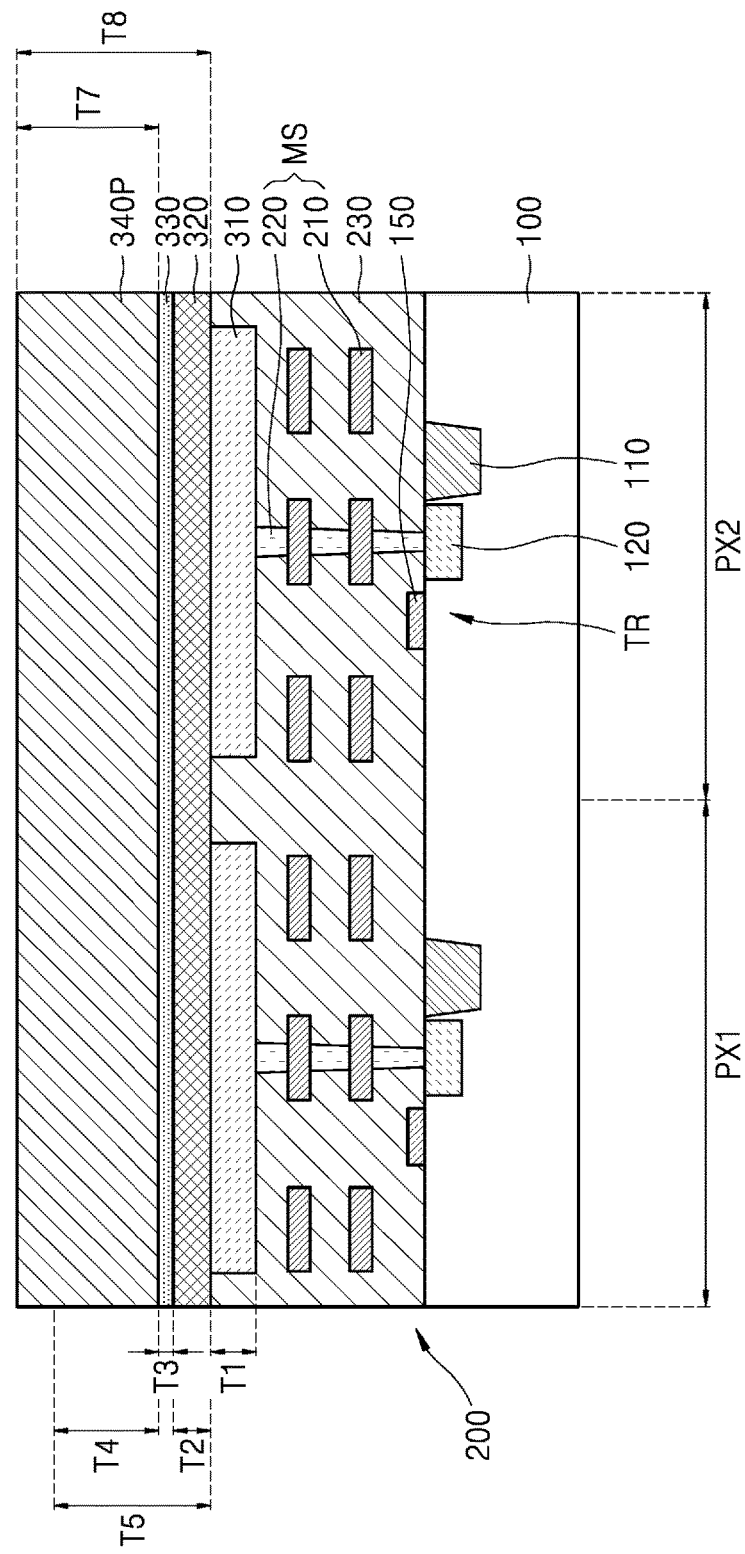

Referring to FIG. 12A, the wiring layer 200 and the plurality of reflective layers 310 may be sequentially formed on the substrate 100, and subsequently the photoelectric conversion layer 320, the transparent electrode layer 330, and a preliminary insulating layer 340p may be sequentially formed on the plurality of reflective layers 310.

Figure 12B:
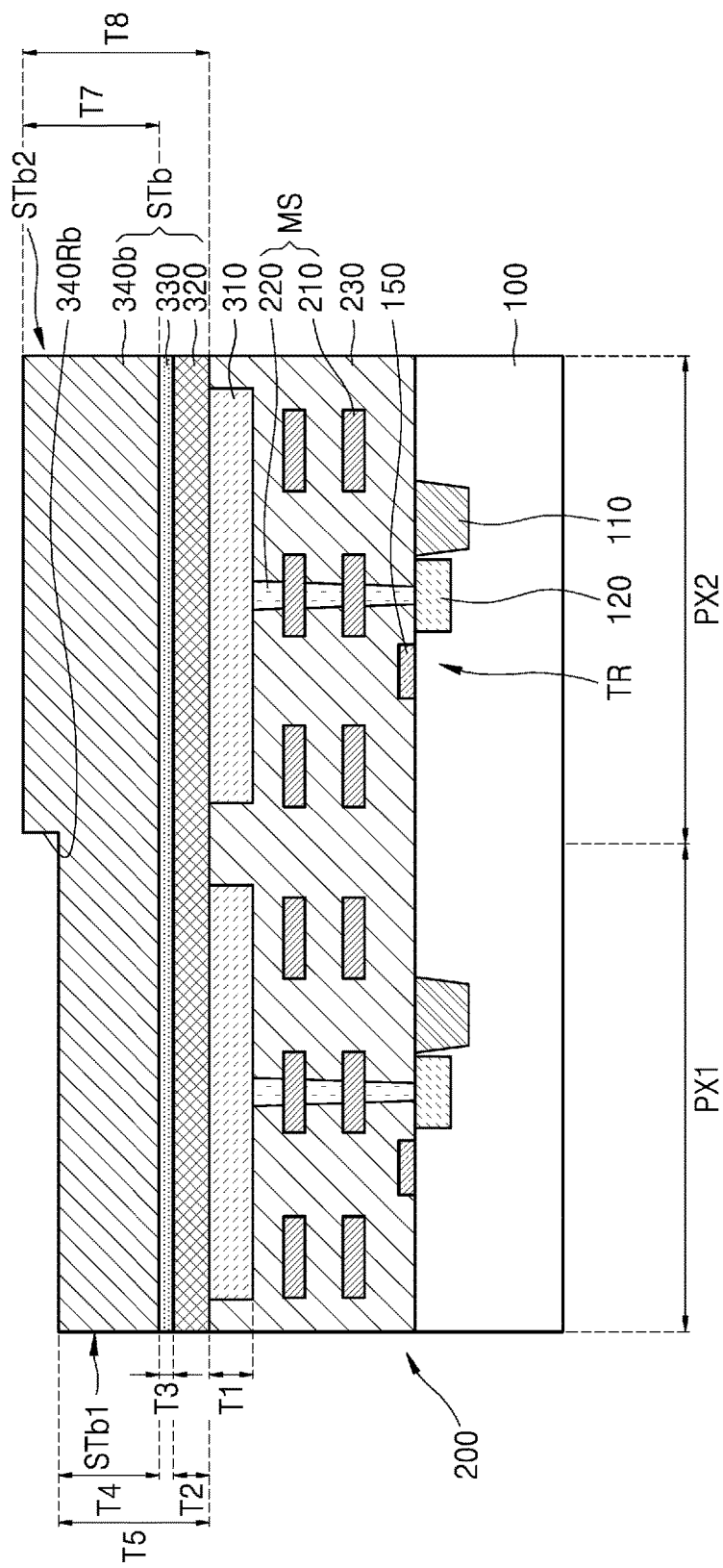

Referring to FIGS. 12A and 12B together, a portion of the preliminary insulating layer 340p may be removed to form the insulating optical spacer 340b having at least one pixel recess 340Rb. As shown in FIG. 8, the semi-permeable metal layer 350i, the passivation layer 360f and the plurality of microlenses 370 may be subsequently disposed thereon to form the photoelectric conversion device 4.

It is obvious to those skilled in the art that the photoelectric conversion devices 3, 3a, 3b, and 3c shown in FIGS. 6A to 7B may also be formed with reference to FIGS. 9A to 12, and a detailed description thereof will be omitted for convenience of explanation.

Figure 13:
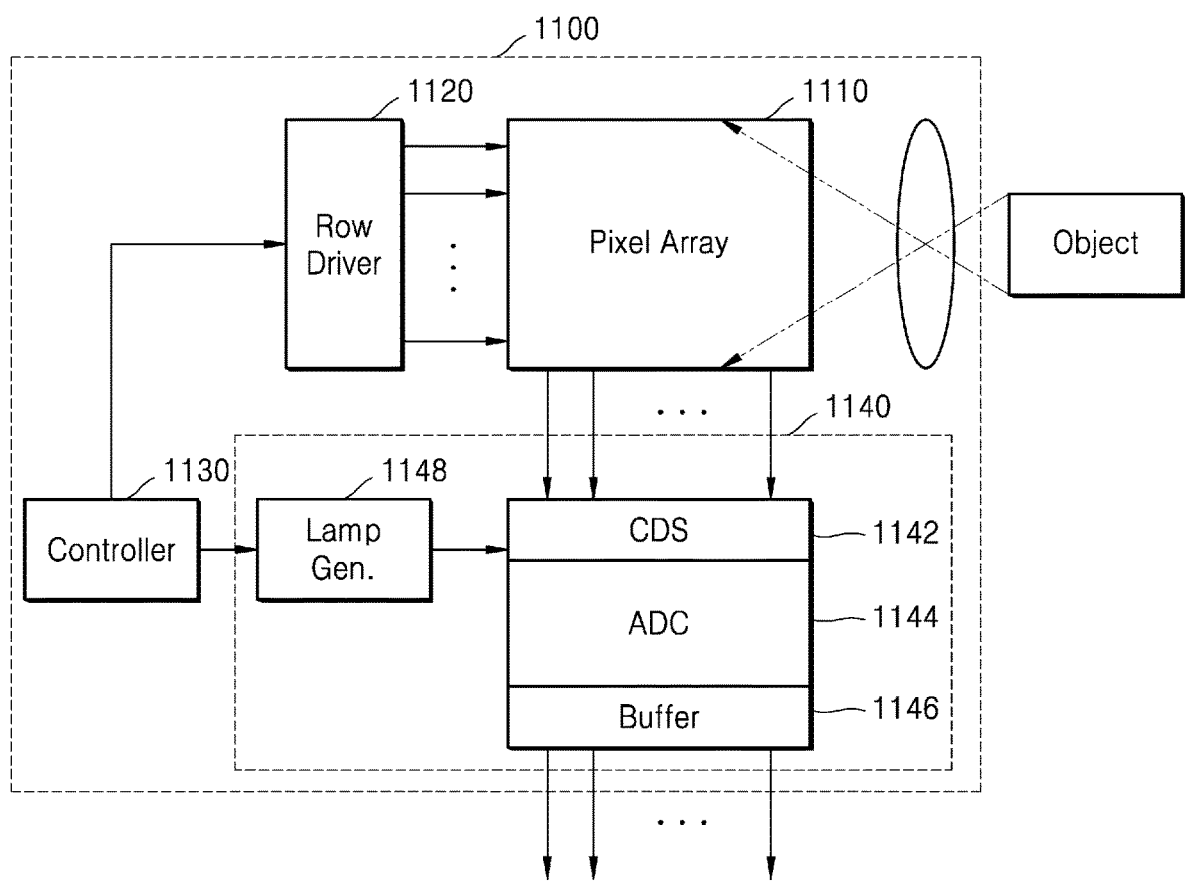
FIG. 13 is a block diagram illustrating a configuration of a photoelectric conversion device according to an embodiment of the present inventive concepts.

FIG. 13 is a block diagram illustrating a configuration of a photoelectric conversion device according to an embodiment of the present inventive concepts.

Referring to FIG. 13, a photoelectric conversion device 1100 may include a pixel array 1110, a controller 1130, a row driver 1120, and a pixel signal processing unit 1140. The photoelectric conversion device 1100 may include at least one of the photoelectric conversion devices 1, 1a, 1b, 2, 2a, 3, 3a, 3b, 3c, and 4 described in FIGS. 1 to 8.

The pixel array 1110 may include a plurality of unit pixels arranged in two dimensions, and each unit pixel may include a photoelectric conversion layer. The photoelectric conversion layer may absorb light to generate charges, and an electrical signal (e.g., output voltage) according to the generated charges may be provided to the pixel signal processing unit 1140 through vertical signal lines. In an embodiment, the unit pixels included in the pixel array 1110 may provide an output voltage one at a time in a row unit, thereby, the unit pixels belonging to any one row of the pixel array 1110 may be activated simultaneously by a selection signal out from the row driver 1120. The unit pixels belonging to the row to be selected may provide the output voltage according to the absorbed light to an output line of a corresponding column.

The controller 1130 may control the row driver 1120 so that the pixel array 1110 absorbs the light and accumulates the charges, temporarily stores the accumulated charges, and outputs the electrical signal according to the stored charges to the outside of the pixel array 1110. Further, the controller 1130 may control the pixel signal processing unit 1140 to measure the output voltage to be provided by the pixel array 1110.

As shown in the embodiment of FIG. 13, the pixel signal processing unit 1140 may include a correlated double sampler (CDS) 1142, an analog-to-digital converter (ADC) 1144, and a buffer 1146. The correlation dual sampler 1142 may sample and hold the output voltage provided by the pixel array 1110. The correlation dual sampler 1142 may double sample a specific noise level and a level according to the generated output voltage, and output a level corresponding to the difference therebetween. In addition, the correlation dual sampler 1142 may receive a lamp signal generated by a lamp signal generator 1148 and compare to each other to output the comparison result. The analog-to-digital converter 1144 may convert an analog signal corresponding to the level received from the correlation dual sampler 1142 into a digital signal. The buffer 1146 may latch the digital signal, and the latched signal may be sequentially output to the outside of the photoelectric conversion device 1100 and transmitted to an image processor.

Figure 14:
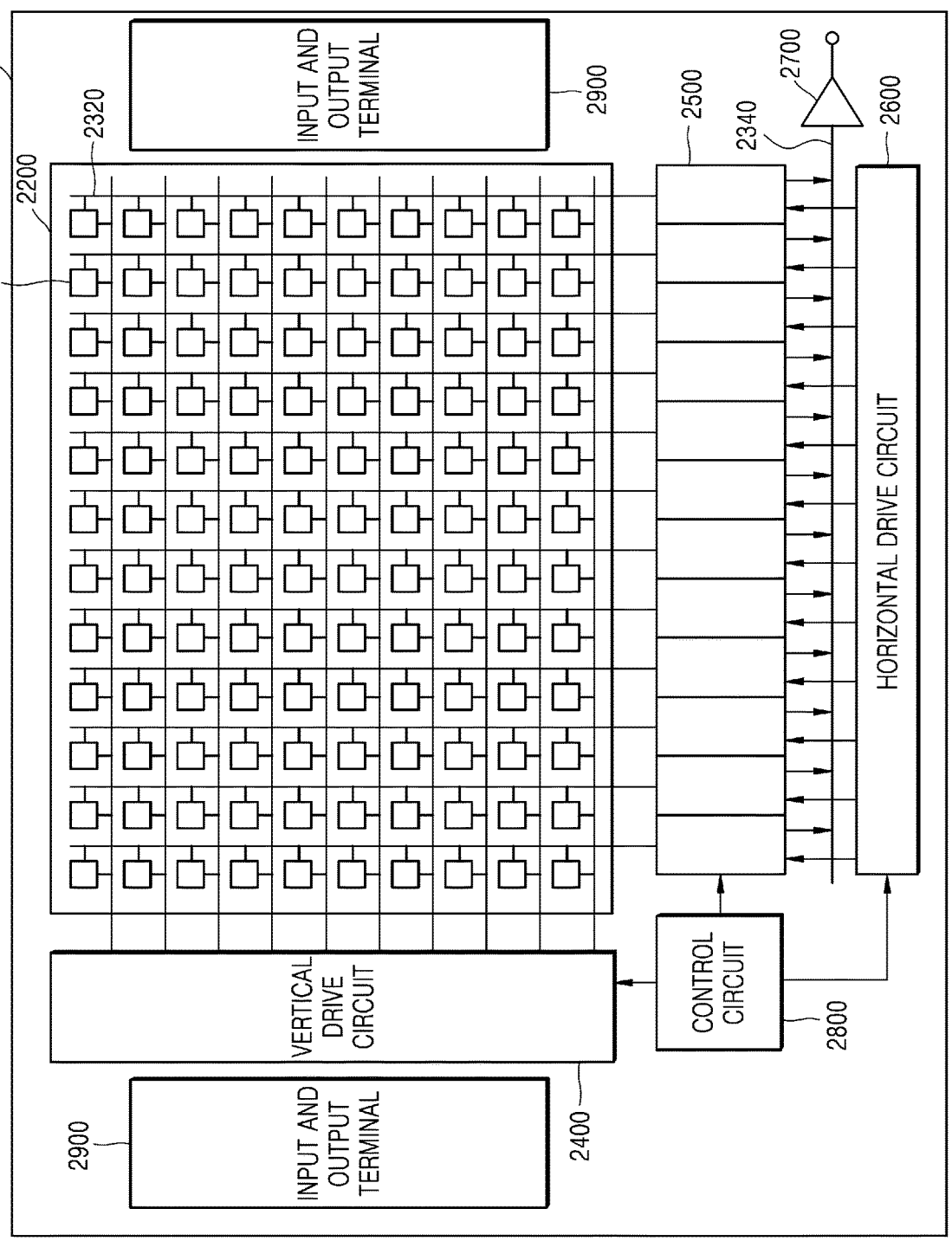
FIG. 14 is a block diagram illustrating a configuration of a photoelectric conversion device according to an embodiment of the present inventive concepts.

FIG. 14 is a block diagram illustrating a configuration of a photoelectric conversion device according to an embodiment of the present inventive concepts.

Referring to FIG. 14, in an embodiment, a photoelectric conversion element 2000 may include a pixel portion 2200 and a peripheral circuit portion. The pixel portion 2200 may be formed by regularly arranging a plurality of pixel 2100 in a substrate 2010 in a two-dimensional array structure, the plurality of pixel 2100 including a photoelectric conversion layer. The photoelectric conversion device 2000 may include at least one of the photoelectric conversion devices 1, 1a, 1b, 2, 2a, 3, 3a, 3b, 3c, and 4 described in FIGS. 1 to 8.

The peripheral circuit portion may be disposed around the pixel portion 2200 and include a vertical drive circuit 2400, a column signal processing circuit 2500, a horizontal drive circuit 2600, an output circuit 2700, and a control circuit 2800.

The control circuit 2800 may control the vertical drive circuit 2400, the column signal processing circuit 2500, and the horizontal drive circuit 2600, and the like. For example, in an embodiment, the control circuit 2800 may generate a vertical synchronization signal, a horizontal synchronization signal, and clock or control signals that serve as a reference for operations of the vertical drive circuit 2400, the column signal processing circuit 2500, and the horizontal drive circuit 2600, and the like, based on a master clock. In addition, the control circuit 2800 may input the clock or control signals to the vertical drive circuit 2400, the column signal processing circuit 2500, and the horizontal drive circuit 2600, and the like.

In an embodiment, the vertical drive circuit 2400 may include, for example, a shift register, in which the pixel may be driven in a row unit, by selecting a pixel driving wiring and supplying a pulse for driving the pixel to the selected pixel driving wiring. For example, the vertical drive circuit 2400 may sequentially and selectively scan the pulse to each pixel 2100 of the pixel portion 2200 in the vertical direction in row unit. Further, through the vertical signal line 2320, the pixel signal according to the charges generated in the photoelectric conversion layer of each pixel 2100 may be supplied to the column signal processing circuit 2500.

The column signal processing circuit 2500 may be arranged for each column of the pixel 2100 and perform signal processing such as noise removal for each pixel column of signals output from the pixel 2100 for one column. For example, the column signal processing circuit 2500 may perform the signal processing, such as a correlated double sampling or signal amplification, AD conversion, and the like for removing the noise inherent in the pixels 2100. In an embodiment, the horizontal selection switch may be provided at an output terminal of the column signal processing circuit 2500.

The horizontal drive circuit 2600 may include, for example, the shift register, and by sequentially outputting a horizontal scan pulse, the horizontal drive circuit 2600 may output the pixel signal of each of the column signal processing circuit 2500 to a horizontal signal line 2340 through the selection of each of the column signal processing circuits 2500 in order.

An output circuit 2700 may perform signal processing and output for signals that are sequentially supplied through the horizontal signal line 2340 in each of the column signal processing circuits 2500. For example, the output circuit 2700 may only perform buffering, or may perform black level adjustment, thermal uneven calibration, various digital signal processing, and the like. On the other hand, an input/output terminal 2900 may exchange signals with the outside.

Figure 15:
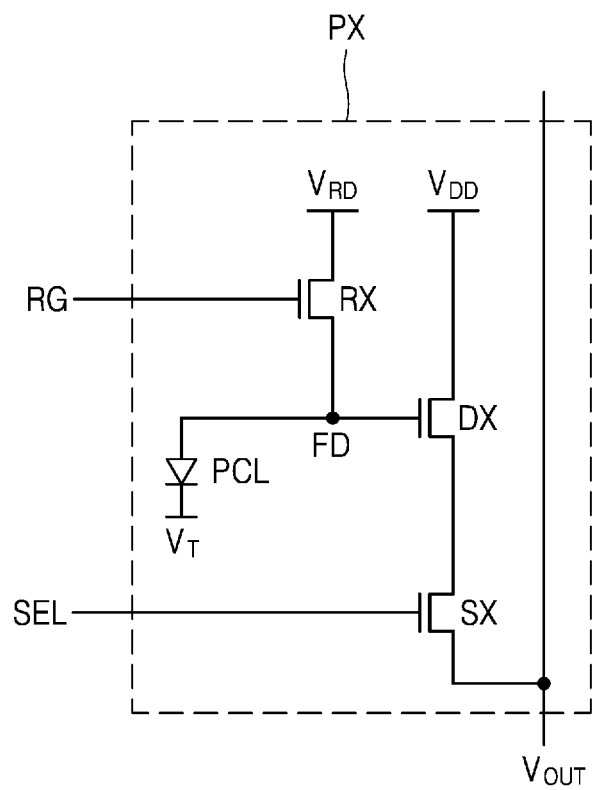
FIG. 15 is a lead-out circuit diagram of a photoelectric conversion device according to an embodiment of the present inventive concepts.

FIG. 15 is a lead-out circuit diagram of a photoelectric conversion device according to an embodiment of the present inventive concepts.

Referring to FIG. 15, a plurality of pixels PX may be arranged in a matrix form. Each of the plurality of pixels PX may include three logic transistors. In an embodiment, the logic transistors may include a reset transistor RX, a selection transistor SX, and a drive transistor DX (or a source follower transistor). Each of the plurality of pixels PX may further include a photoelectric conversion layer PCL and a floating diffusion region FD.

The plurality of pixels PX may correspond to the plurality of pixel regions, such as the first and second pixel regions PX1 and PX2, described in FIGS. 1 to 8. The logic transistors RX, SX, and DX may be implemented by the plurality of transistors TR described in FIGS. 1 to 8. The photoelectric conversion layer PCL may be implemented by the photoelectric conversion layer 320 described in FIGS. 1 to 8. FIG. The photoelectric conversion layer PCL may generate and accumulate light charges in proportion to the amount of light incident from the outside. In some embodiments, the floating diffusion region FD may be implemented by the impurity region 120 described in FIGS. 1 to 8.

A gate terminal of the drive transistor DX may be connected to the floating diffusion region FD. The drive transistor DX may operate as a source follower buffer amplifier by charges accumulated in the floating diffusion region FD and amplify the potential change in the floating diffusion region FD and output the same as the output voltage VOUT to a column line.

In an embodiment, the selection transistor SX may select the plurality of pixels PX in row units, and when the selection transistor SX is turned on, the power supply voltage VDD may be delivered to a source electrode of the drive transistor DX. A row driver may operate by a selection control signal SEL to be input, and switching and addressing operations may be performed. When the selection control signal SEL is applied from the row driver, the output voltage VOUT may be output to the column line connected to the selection transistor SX.

The reset transistor RX may periodically reset the charges accumulated in the floating diffusion region FD. A drain electrode of the reset transistor RX may be connected to the floating diffusion region FD, and the row driver may reset a voltage of the floating diffusion region FD into a lead-out voltage VRD by a reset control signal RG to be input in the row driver.

A cathode connected to the photoelectric conversion layer PCL may be connected to the floating diffusion region FD and an anode connected to the photoelectric conversion layer PCL may be connected to an upper electrode voltage VT. In an embodiment, the photoelectric conversion layer PCL may use holes as a main charge carrier, and therefore, the drain electrode of the reset transistor RX may be connected to the power supply voltage VDD and the other lead voltage VRD.

While the present inventive concepts have been particularly shown and described with reference to non-limiting embodiments thereof, it will be understood that various changes in form and details may be made therein without departing from the spirit and scope of the present inventive concepts.

What is claimed is:

1. A photoelectric conversion device comprising:
a substrate;
a wiring layer disposed on the substrate and comprising a wiring structure and a wiring insulating layer that surrounds the wiring structure;
a reflective layer disposed on the wiring layer, the reflective layer is electrically connected to the wiring structure;
a semi-permeable metal layer spaced apart from the reflective layer in a thickness direction of the substrate, the semi-permeable metal layer faces the reflective layer to form a microcavity between the reflective layer and the semi-permeable metal layer; and
a stacked structure between the reflective layer and the semi-permeable metal layer in the thickness direction of the substrate, the stacked structure comprising a photoelectric conversion layer, a transparent electrode layer, and an insulating optical spacer, an upper surface of the insulating optical spacer directly contacting a lower surface of the semi-permeable metal layer and a lower surface of the insulating optical spacer directly contacting an upper surface of the transparent electrode layer.

2. The photoelectric conversion device of claim 1, wherein a thickness of the photoelectric conversion layer is less than a thickness of the insulating optical spacer.

3. The photoelectric conversion device of claim 1, wherein the photoelectric conversion layer comprises at least one material selected from organic photoelectric material, quantum dot material, organic perovskite material, and inorganic perovskite material.

4. The photoelectric conversion device of claim 1, wherein a thickness of the reflective layer is greater than a thickness of the semi-permeable metal layer.

5. The photoelectric conversion device of claim 1, further comprising:
a passivation layer covering the semi-permeable metal layer; and
a microlens on the passivation layer.

6. The photoelectric conversion device of claim 5, wherein the semi-permeable metal layer comprises an opening disposed to overlap a center portion of the microlens in the thickness direction of the substrate, the opening extending from a top surface of the semi-permeable metal layer to a bottom surface thereof to expose the insulating optical spacer positioned at a bottom surface of the opening.

7. The photoelectric conversion device of claim 5, wherein the semi-permeable metal layer comprises at least one recess disposed to overlap a center portion of the microlens in the thickness direction of the substrate, the at least one recess extending from a top surface of the semi-permeable metal layer toward a bottom surface thereof to expose a portion of the semi-permeable metal layer positioned at a bottom surface of the at least one recess.

8. The photoelectric conversion device of claim 5, wherein the insulating optical spacer comprises a trench disposed so as to overlap an edge of the microlens in the thickness direction of the substrate, the trench inwardly extending from a top surface of the insulation optical spacer.

9. The photoelectric conversion device of claim 8, further comprising a light blocking wall filling the trench of the insulating optical spacer.

10. The photoelectric conversion device of claim 8, further comprising a light blocking wall that conformally covers an inner sidewall and a bottom surface of the trench of the insulating optical spacer to fill a portion of the trench of the insulating optical spacer.

11. A photoelectric conversion device comprising:
a substrate comprising a plurality of pixel regions;
a wiring layer disposed on the substrate and comprising a wiring structure and a wiring insulating layer that surrounds the wiring structure;
a plurality of reflective layers disposed on the wiring layer, the plurality of reflective layers is electrically connected to the wiring structure and corresponds to the plurality of pixel regions, respectively, each reflective layer of the plurality of reflective layers functions as a lower electrode;
a photoelectric conversion layer disposed on the plurality of reflective layers and extending over the plurality of pixel regions;
a transparent electrode layer covering the photoelectric conversion layer and functioning as an upper electrode;
an insulating optical spacer covering the transparent electrode layer;
a semi-permeable metal layer spaced apart from the plurality of reflective layers in a thickness direction of the substrate, the semi-permeable metal layer faces the plurality of reflective layers to form a plurality of microcavities therebetween, the semi-permeable metal layer covers the insulating optical spacer over the plurality of pixel regions;
a passivation layer covering the semi-permeable metal layer; and
a plurality of microlenses disposed on the passivation layer corresponding to the plurality of pixel regions, respectively.

12. The photoelectric conversion device of claim 11, wherein the insulating optical spacer comprises at least one pixel recess corresponding to at least one of the plurality of pixel regions, the passivation layer fills the at least one pixel recess and the semi-permeable metal layer is interposed between the passivation layer filling the at least one pixel recess and the insulating optical spacer in the thickness direction of the substrate,
wherein the semi-permeable metal layer conformally covers the insulating optical spacer, and comprises a first portion covering a bottom surface of the at least one pixel recess, a second portion covering a top surface of the insulating optical spacer except for the at least one pixel recess, and a third portion covering a side surface of the at least one pixel recess.

13. The photoelectric conversion device of claim 11, wherein a thickness of a stacked structure consisting of the photoelectric conversion layer, the transparent electrode layer, and the insulating optical spacer is about ¼ of a wavelength of light to be detected that penetrates the stacked structure.

14. The photoelectric conversion device of claim 11, wherein the insulating optical spacer has a thickness greater than a thickness of the photoelectric conversion layer.

15. The photoelectric conversion device of claim 11, wherein the semi-permeable metal layer has a thickness less than a thickness of the plurality of reflective layers.

16. The photoelectric conversion device of claim 11, wherein the semi-permeable metal layer comprises a plurality of openings or a plurality of recesses disposed to overlap a center portion of the plurality of microlenses in the thickness direction of the substrate and extending from a top surface of the semi-permeable metal layer toward a bottom surface thereof.

17. The photoelectric conversion device of claim 11, wherein:
the insulating optical spacer comprises a trench disposed so as to overlap an edge of the plurality of microlenses in the thickness direction of the substrate, the trench inwardly extending from a top surface of the insulation optical spacer; and
a light blocking wall filling at least a portion of the trench and forming an integrated body having a same material as the semi-permeable metal layer.

18. The photoelectric conversion device of claim 11, wherein:
the reflective layer comprises metal or conductive metal nitride; and
a reflectivity of the reflective layer is greater than a reflectivity of the semi-permeable metal layer.

19. A photoelectric conversion device comprising:
a substrate comprising a plurality of pixel regions;
a wiring layer disposed on the substrate and comprising a wiring structure and a wiring insulating layer that surrounds the wiring structure;
a plurality of reflective layers disposed on the wiring layer, the plurality of reflective layers corresponds to the plurality of pixel regions, respectively, each of the plurality of reflective layers functions as a lower electrode and has a first thickness, the plurality of reflective layers is electrically connected to the wiring structure;

a photoelectric conversion layer extending over the plurality of pixel regions and having a second thickness, the photoelectric conversion layer comprising at least one material selected from organic photoelectric material, quantum dot material, organic perovskite material, and inorganic perovskite material;

a transparent electrode layer covering the photoelectric conversion layer and functioning as an upper electrode, the transparent electrode layer having a third thickness that is less than the first thickness;

an insulating optical spacer covering the transparent electrode layer and having a fourth thickness that is greater than the second thickness;

a semi-permeable metal layer over the plurality of pixel regions and covering the insulating optical spacer, the semi-permeable metal layer faces the plurality of reflective layers and is spaced apart from the plurality of reflective layers in a thickness direction of the substrate to form a plurality of microcavities, the semi-permeable metal layer having a fifth thickness that is less than the first thickness;

a passivation layer covering the semi-permeable metal layer; and a plurality of microlenses disposed on the passivation layer and corresponding to the plurality of pixel regions, respectively.

20. The photoelectric conversion device of claim 19, wherein:

the first thickness of the plurality of reflective layers is in a range of about 1,000 Å to about 2,000 Å;

the second thickness of the photoelectric conversion layer is in a range of about 500 Å to about 1,000 Å; and the third thickness of the transparent electrode layer is in a range of about 100 Å to about 300 Å.

* * * * *